United States Patent
Jung et al.

(10) Patent No.: US 11,943,878 B2
(45) Date of Patent: Mar. 26, 2024

(54) DISPLAY DEVICE

(71) Applicant: Samsung Display Co., Ltd., Yongin-si (KR)

(72) Inventors: Sung Ki Jung, Anyang-si (KR); Da Som Gu, Anyang-si (KR); Yun Jae Kim, Cheonan-si (KR); Jai Ku Shin, Hwaseong-si (KR); Yong Chan Jeon, Cheonan-si (KR); Hyun Been Hwang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 148 days.

(21) Appl. No.: 17/447,047

(22) Filed: Sep. 7, 2021

(65) Prior Publication Data

US 2022/0151085 A1 May 12, 2022

(30) Foreign Application Priority Data

Nov. 10, 2020 (KR) ........................ 10-2020-0149256

(51) Int. Cl.
*H05K 5/00* (2006.01)
*H10K 59/40* (2023.01)

(52) U.S. Cl.
CPC ........... *H05K 5/0017* (2013.01); *H10K 59/40* (2023.02)

(58) Field of Classification Search
CPC .... G06F 1/1652; G06F 1/1616; G06F 1/1641; G06F 2203/04102; G06F 3/0412
See application file for complete search history.

(56) References Cited

U.S. PATENT DOCUMENTS

| | | | |
|---|---|---|---|
| 2015/0062525 A1* | 3/2015 | Hirakata | G06F 1/1652 349/158 |
| 2015/0062927 A1* | 3/2015 | Hirakata | H01F 1/14791 362/362 |
| 2017/0068275 A1* | 3/2017 | Lee | G06F 1/1643 |
| 2018/0150108 A1* | 5/2018 | Song | G06F 1/1677 |
| 2018/0190936 A1* | 7/2018 | Lee | B32B 25/20 |
| 2019/0207141 A1* | 7/2019 | Kim | H10K 77/111 |
| 2019/0334114 A1* | 10/2019 | Park | H05K 5/0226 |
| 2020/0241594 A1 | 7/2020 | Cavallaro et al. | |
| 2021/0141124 A1* | 5/2021 | Park | G09F 9/301 |

FOREIGN PATENT DOCUMENTS

| | | |
|---|---|---|
| KR | 10-2015-0011230 A | 1/2015 |
| KR | 10-2019-0124844 A | 11/2019 |
| KR | 10-2020-0091529 A | 7/2020 |

* cited by examiner

*Primary Examiner* — Abhishek M Rathod
(74) *Attorney, Agent, or Firm* — Lewis Roca Rothgerber Christie LLP

(57) ABSTRACT

A display device includes a display panel; a first upper support member on the display panel; and a second upper support member on the display panel and spaced from the first upper support member; and a blocking member including a blocking part crossing the first upper support member and the second upper support member, a first stretchable part connected to a side of the blocking part and including a plurality of openings, a second stretchable part connected to another side of the blocking part and including a plurality of openings, a first fixing part connected to the first stretchable part, and a second fixing part connected to the second stretchable part.

16 Claims, 15 Drawing Sheets

MPLT1: MPLT1_1, MPLT1_2
MPLT2: MPLT2_1, MPLT2_2
MF: MF_BP, MF_PP1, MF_PP2, MF_FP1, MF_FP2

MPLT1: MPLT1_1, MPLT1_2
MPLT2: MPLT2_1, MPLT2_2
MF: MF_BP, MF_PP1, MF_PP2, MF_FP1, MF_FP2

MPLT1: MPLT1_1, MPLT1_2
MPLT2: MPLT2_1, MPLT2_2
MF: MF_BP, MF_PP1, MF_PP2, MF_FP1, MF_FP2

DISPLAY DEVICE

CROSS-REFERENCE TO RELATED APPLICATION

This application claims priority to and the benefit of from Korean Patent Application No. 10-2020-0149256 filed on Nov. 10, 2020 in the Korean Intellectual Property Office (KIPO), the entire contents of which are incorporated by reference herein.

BACKGROUND

1. Field

The present disclosure relates to a display device.

2. Description of Related Art

The importance of display devices is increasing along with the development of multimedia. Accordingly, various types of display devices, such as liquid crystal displays (LCDs) and organic light-emitting diode (OLED) displays, are being used.

Recently, the proportion of mobile electronic devices, which have a volume or thickness less than or equal to that of other devices but have a larger display screen, is increasing, and foldable or bendable display devices, which have a structure that is foldable or bendable in order to selectively provide a larger screen when in use, are being developed.

Members constituting the foldable display device may be disposed to be separated based on a folding area in order to mitigate bending stress or the like. In this case, a foreign material may be introduced into the display device from the outside through a gap formed between the separated members.

SUMMARY

Aspects of one or more embodiments of the present disclosure are directed towards a display device capable of blocking the infiltration of foreign matter.

It should be noted that objects of the present disclosure are not limited to the above-described objects, and other objects of the present disclosure will be apparent to those skilled in the art from the following descriptions.

According to an embodiment of the present disclosure, a display device includes a display panel; a first upper support member on the display panel; and a second upper support member on the display panel and spaced from the first upper support member; and a blocking member (e.g., a foreign material blocking member) including a blocking part crossing the first upper support member and the second upper support member, a first stretchable part connected to a side of the blocking part and including a plurality of openings, a second stretchable part connected to another side of the blocking part and including a plurality of openings, a first fixing part connected to the first stretchable part, and a second fixing part connected to the second stretchable part.

A width of the blocking part may be greater than a distance between the first upper support member and the second upper support member.

A strain rate of each of the first stretchable part and the second stretchable part may be greater than that of the blocking part.

The first stretchable part and the second stretchable part may be stretched in a direction intersecting a thickness direction of the first stretchable part and the second stretchable part, respectively.

The first fixing part and the second fixing part may be attached to the first upper support member and the second upper support member, respectively.

The blocking part, the first stretchable part, and the second stretchable part may not be attached to the first upper support member and the second upper support member.

At least one of the blocking part, the first stretchable part, and the second stretchable part may move in a sliding manner with respect to at least one of the first upper support member and the second upper support member.

The display device may further include a first coupling member coupling the first fixing part to the first upper support member, and a second coupling member coupling the second fixing part to the second upper support member.

The display device may further include a first lower support member overlapping the first upper support member in a thickness direction of the first lower support member, and a second lower support member overlapping the second upper support member in a thickness direction of the second lower support member.

The first stretchable part and the first fixing part may be between the first upper support member and the first lower support member. The second stretchable part and the second fixing part may be between the second upper support member and the second lower support member.

The display device may further include a first coupling member coupling the first upper support member to the first lower support member, and a second coupling member coupling the second upper support member to the second lower support member.

The blocking member may include recessed portions recessed inward in a plan view. The first coupling member and the second coupling member may be arranged in the recessed portions.

The first stretchable part may be greater in area than the first fixing part. The second stretchable part may be greater in area than the second fixing part. The second stretchable part may be smaller in area than the second fixing part.

The first stretchable part may be smaller in area than the first fixing part. The second stretchable part may be smaller in area than the second fixing part.

Each of the first upper support member and the second upper support member may include a metal. The blocking part may include a plastic.

According to an embodiment of the present disclosure, a display device includes a display panel; a first upper support member on the display panel; and a second upper support member on the display panel and spaced from the first upper support member; and a blocking member (e.g., a foreign material blocking member) including a first non-pattern area crossing the first upper support member and the second upper support member, a first pattern area connected to a side of the first non-pattern area and including a plurality of openings, a second pattern area connected to another side of the first non-pattern area and including a plurality of openings, a second non-pattern area connected to the first pattern area, and a third non-pattern area connected to the second pattern area.

A width of the first non-pattern area may be greater than a distance between the first upper support member and the second upper support member.

A strain rate of each of the first pattern area and the second pattern area may be greater than that of the first non-pattern area.

The second non-pattern area and the third non-pattern area may be attached to the first upper support member and the second upper support member, respectively.

According to an embodiment of the present disclosure, a display device includes a display panel including a folding area; and a blocking member (e.g., a foreign material blocking member) including a blocking part overlapping the folding area, a first stretchable part connected to a side of the blocking part and having a strain rate greater than that of the blocking part, and a second stretchable part connected to another side of the blocking part and having a strain rate greater than that of the blocking part.

Details according to one or more embodiments of the present disclosure are included in the following detailed description and the drawings.

BRIEF DESCRIPTION OF THE DRAWINGS

The above and other aspects and features of the present disclosure will become more apparent by describing embodiments thereof in more detail with reference to the attached drawings, in which.

DETAILED DESCRIPTION

Figure 1:
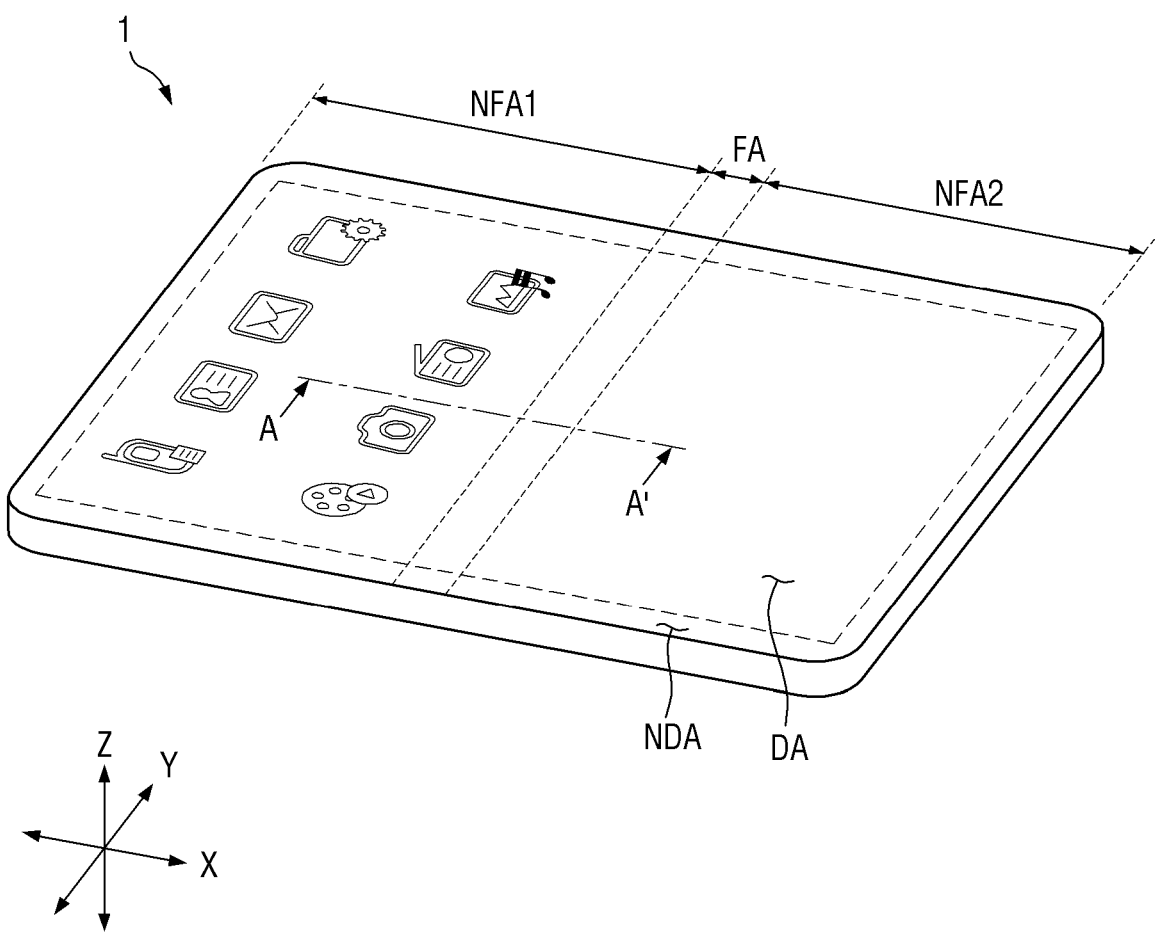
FIG. 1 is a perspective view of a display device according to an embodiment.

The present disclosure will now be described more fully hereinafter with reference to the accompanying drawings, in which preferred embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers indicate the same or like components throughout the specification, and therefore, a redundant description thereof may not be repeated. In the attached figures, the thickness of layers and regions may be exaggerated for clarity.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

It will also be understood that when a layer is referred to as being "on" another layer or substrate, it can be directly on the other layer or substrate, or one or more intervening layers may also be present. In contrast, when an element is referred to as being "directly on" another element, there are no intervening elements present.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, specific embodiments will be described with reference to the accompanying drawings.

Figure 2:
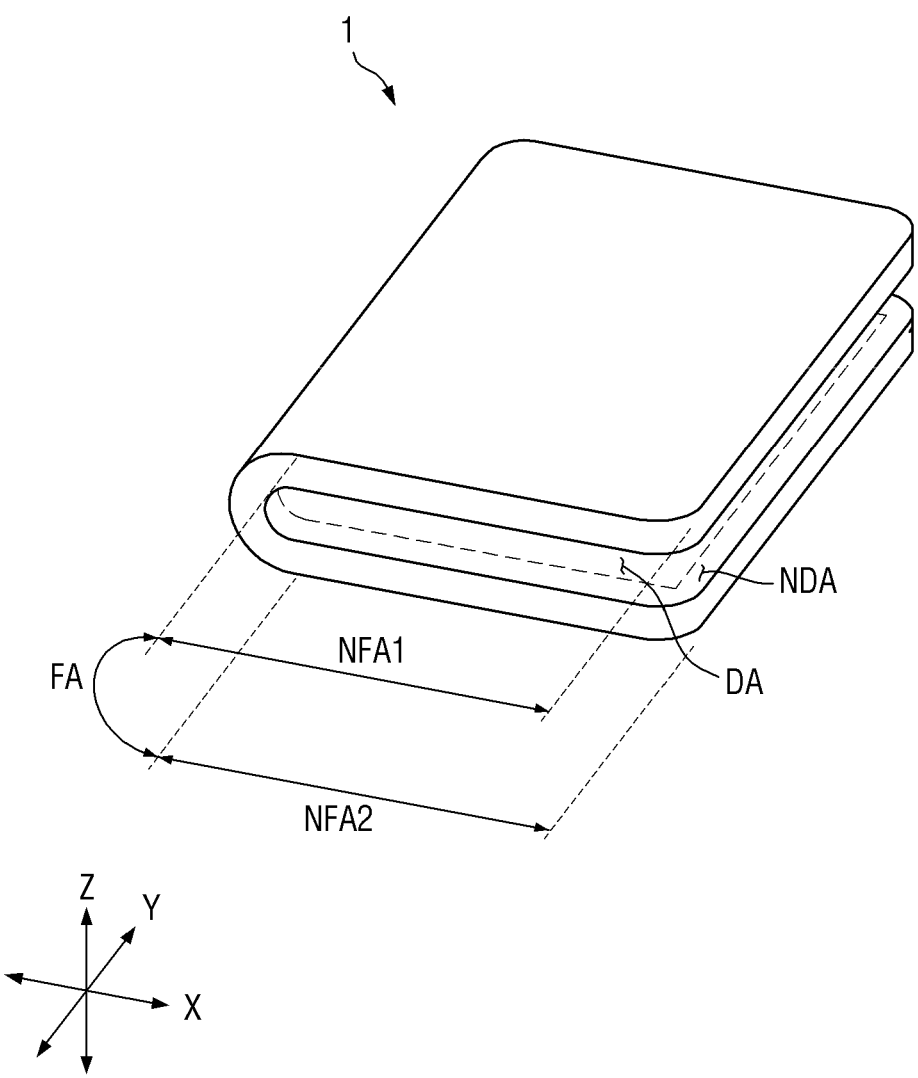
FIG. 2 is a perspective view of the display device in a folded state according to an embodiment.
Figure 3:
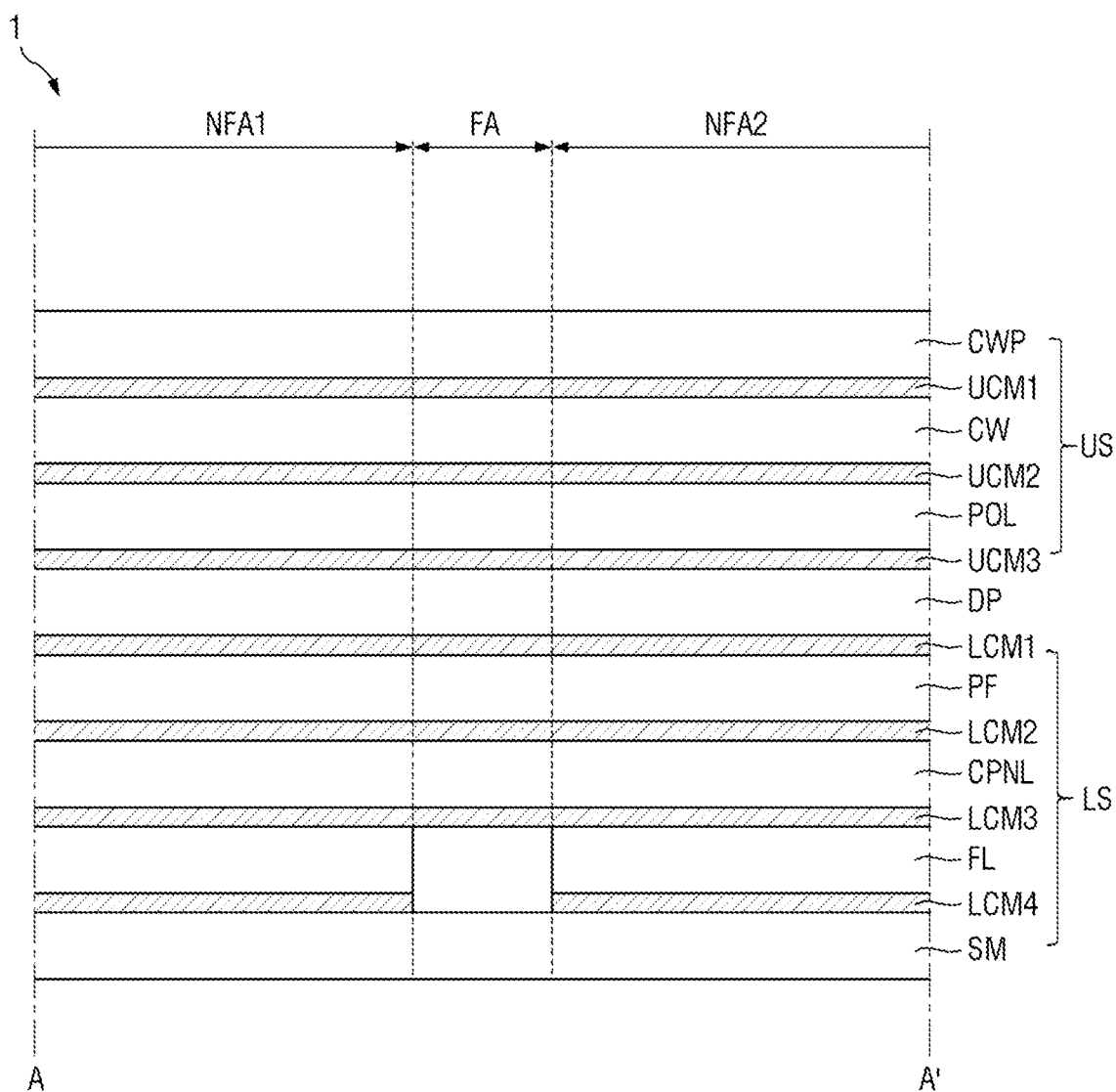
FIG. 3 is a cross-sectional view taken along the line A-A' of FIG. 1.
Figure 4:
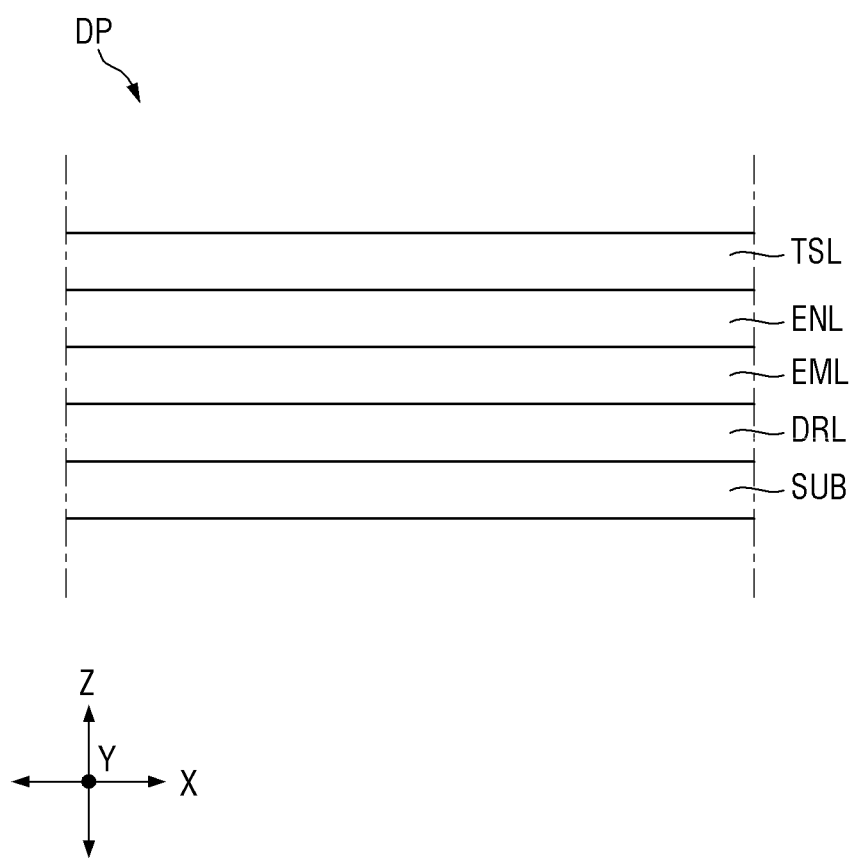
FIG. 4 is a cross-sectional view illustrating a display panel according to an embodiment.

FIG. 1 is a perspective view of a display device according to an embodiment. FIG. 2 is a perspective view of the display device in a folded state according to an embodiment. FIG. 3 is a cross-sectional view taken along the line A-A' of FIG. 1. FIG. 4 is a cross-sectional view illustrating a display panel according to an embodiment.

Hereinafter, a first direction X, a second direction Y, and a third direction Z are different directions intersecting each other. For example, the first direction X may be a length direction, the second direction Y may be a width direction, and the third direction Z may be a thickness direction. The first direction X, the second direction Y, and the third direction Z may include two or more directions (e.g., directions forming an axis). For example, the third direction Z may include an upward direction toward an upper side in the drawing and a downward direction toward a lower side in the drawing. In this case, one surface of a member disposed to face in the upward direction may be referred to as an upper surface, and the other surface of the member disposed to face in the downward direction may be referred to as a lower surface. However, each of the directions should be understood as referring to a relative direction and are not limited to the above example.

A display device 1 according to an embodiment of the present disclosure may include various suitable devices displaying a screen or an image. The display device 1 may include, for example, a smartphone, a mobile phone, a tablet personal computer (PC), a personal digital assistant (PDA), a portable multimedia player (PMP), a television, a game machine, a wrist watch-type electronic device, a head-mounted display, a PC monitor, a laptop computer, a vehicle navigation device, a vehicle instrument panel, a digital camera, a camcorder, an outdoor billboard, an electric sign board, various suitable medical devices, various suitable inspection devices, various suitable household appliances including a display unit DPA such as a refrigerator and a washing machine, and a device for the Internet of Things, but the present disclosure is not limited thereto.

Referring to FIG. 1, the display device 1 may have a rectangular shape in a plan view. In an embodiment, the display device 1 may have two long sides extending in the first direction X and two short sides in the second direction Y intersecting the first direction X in the plan view. However, the present disclosure is not limited thereto, and the display device 1 may have various suitable shapes.

The display device 1 may include a display area DA and a non-display area NDA.

A video or an image may be displayed on the display area DA. A plurality of pixels may be disposed in the display area DA. As shown in FIG. 1, the display area DA may be disposed on an upper surface of the display device 1. However, the present disclosure is not limited thereto, and the display area DA may be further disposed on at least one of a lower surface and a side surface of the display device 1.

A video or an image may not be displayed on the non-display area NDA.

The non-display area NDA may be disposed around the display area DA. The non-display area NDA may surround the display area DA. For example, the non-display area NDA may be an area in which a light-blocking member such as a black matrix is disposed. In an embodiment, the display area DA may have a rectangular shape, and the non-display area NDA may be disposed around the four sides of a display unit, but the present disclosure is not limited thereto.

Referring to FIG. 2, the display device 1 may be a foldable device. For example, at least a portion of the display device 1 may be bent to be reversibly folded or unfolded. Specifically, the display device 1 may be bent such that a portion of the display device 1 overlaps (e.g., overlaps in a plan view) another portion of the display device 1, the portion of the display device 1 is inclined with respect to the other portion of the display device 1, or the portion of the display device 1 and the other portion of the display device 1 are unfolded and aligned to form a flat surface. In an embodiment, when the portion of the display device 1 and the other portion of the display device 1 are unfolded, the entirety of the display device 1 is unfolded (e.g., flatly unfolded). However, the present disclosure is not limited thereto. In an embodiment, a portion of the display device 1 may be folded to be greater than about 0° and less than 180° with respect to the other portion of the display device 1 or may be unfolded to form an inclination of about 180° with respect the other portion of the display device 1.

The display device 1 may be in-folded or in-folding. As shown in FIG. 2, the in-folding may refer to a portion of a surface on which the display area DA of the display device 1 is positioned being folded to face another portion of the surface on which the display area DA is positioned. However, the present disclosure is not limited thereto, and the display device 1 may be out-folded. For example, out-folding or out-folded may refer to a portion of a surface, which is opposite to the surface on which the display area DA is positioned, being folded to face another portion of the opposite surface such that the portion of the surface on which the display area DA is positioned does not face (e.g., faces away from) the other portion of the surface on which the display area DA is positioned during folding. The display device 1 may be a bidirectional foldable device that is in-foldable as well as out-foldable. However, the present disclosure is not limited thereto.

The display device 1 may have a folded state or an unfolded state. The folded state includes a state in which the display device 1 is bent. Specifically, the folded state may be a state in which a portion of the display device 1 is bent to be inclined with respect to the other portion of the display device 1, and the unfolded state may be a state in which a portion of the display device 1 is disposed to be coplanar and parallel with the other portion of the display device 1. Alternatively, the folded state may be a state in which an angle between a portion of the display device 1 and the other portion of the display device 1 is about 0° or more and less than 180° and/or is greater than 180° and less than 360°, and the unfolded state may be a state in which an angle between a portion of the display device 1 and the other portion of the display device 1 is about 180°. Here, the portion of the display device 1 and the other portion of the display device 1 may be non-folding areas NFA1 and NFA2 to be described in more detail below, respectively. The folded state may refer to an in-folded state in which the display device 1 is in-folded and an out-folded state in which the display device 1 is out-folded.

The display device 1 may be divided into a folding area FA, a first non-folding area NFA1, and a second non-folding area NFA2. In an embodiment, members constituting the display device 1 may also be divided into the first non-folding area NFA1, the second non-folding area NFA2, and/or the folding area FA.

The folding area FA is an area that is foldable or bendable as the display device 1 is folded or bent. The non-folding areas NFA1 and NFA2 are areas that are not foldable or bendable.

The non-folding areas NFA1 and NFA2 may include the first non-folding area NFA1 and the second non-folding area NFA2. In an embodiment, the first non-folding area NFA1 and the second non-folding area NFA2 may be arranged in the first direction X, and the folding area FA may be disposed between the first non-folding area NFA1 and the second non-folding area NFA2. In an embodiment, one folding area FA and two non-folding areas NFA1 and NFA2 are defined in the display device 1, but the present disclosure is not limited thereto. For example, any suitable number of folding areas and non-folding areas may be defined in the display device 1.

Referring to FIG. 3, the display device 1 may include a display panel DP, an upper stack structure US on (e.g., stacked on) an upper surface of the display panel DP, and a lower stack structure on (e.g., stacked on) a lower surface of the display panel DP.

The upper surface of the display panel DP may be a surface on which a video or an image is displayed, and the lower surface of the display panel DP may be a surface opposite to the upper surface.

The display panel DP, the upper stack structure US, and the lower stack structure LS may be disposed throughout the first non-folding area NFA1, the folding area FA, and the second non-folding area NFA2. At least one of members constituting the upper stack structure US and the lower stack structure LS may be separated based on the folding area FA. Due to the separation as described above, it is possible to reduce bending stress generated when the display device 1 is folded and/or to reduce an amount of torque to fold the display device 1.

The display panel DP is a panel on which a screen or an image is displayed. Examples of the display panel DP include self-luminous display panels such as an organic light-emitting diode (OLED) display panel, an inorganic electro-luminescence (EL) display panel, a quantum dot light-emitting display (QLED) panel, a micro light-emitting display (micro LED) panel, a nano LED panel, a plasma display panel (PDP), a field emission display (FED) panel, and a cathode ray tube (CRT) display panel as well as light-receiving display panels such as a liquid crystal display (LCD) panel and an electrophoretic display (EPD) panel.

The display panel DP may further include a touch member. The touch member may be provided as a panel or film separate from the display panel DP and attached onto the display panel DP or may be provided in the form of a touch layer inside the display panel DP. In the following embodiment, a case will be described in which the touch member is provided inside the display panel DP and included in the display panel DP, but the present disclosure is not limited thereto.

Referring to FIG. 4, the display panel DP may include a substrate SUB, a circuit driving layer DRL on the substrate SUB, a light-emitting layer EML on the circuit driving layer DRL, an encapsulation layer ENL on the light-emitting layer EML, and a touch layer TSL on the encapsulation layer ENL.

The substrate SUB may be a flexible substrate including a flexible polymer material such as polyimide (PI). Accordingly, the display panel DP may be bendable, foldable, or rollable.

The circuit driving layer DRL may be disposed on the substrate SUB. The circuit driving layer DRL may include a circuit for driving the light-emitting layer EML of the pixel. The circuit driving layer DRL may include a plurality of thin film transistors.

The light-emitting layer EML may be disposed on the circuit driving layer DRL. The light-emitting layer EML may include an organic light-emitting layer. The light-emitting layer EML may emit light with various levels of luminance according to a driving signal transmitted from the circuit driving layer DRL.

The encapsulation layer ENL may be disposed on the light-emitting layer EML. The encapsulation layer ENL may include an inorganic film or a stacked film of an inorganic film and an organic film.

The touch layer TSL may be disposed on the encapsulation layer ENL. The touch layer TSL may be a layer that detects a touch input and may perform a function of a touch member. The touch layer TSL may include a plurality of sensing areas and a plurality of sensing electrodes.

Referring again to FIG. 3, the upper stack structure US may include a polarization member POL, a cover window CW, and a cover window protection layer CWP which are stacked (e.g., sequentially stacked) upward from the display panel DP.

The polarization member POL may be disposed on the upper surface of the display panel DP. For example, the polarization member POL may be disposed on the upper surface of the display panel DP with a third upper coupling member UCM3 therebetween. The polarization member POL may polarize light passing therethrough. The polarization member POL may serve to reduce the reflection of external light. The polarization member POL may be a polarization film. The polarization member POL may be replaced with a plurality of color filters and a black matrix disposed therebetween.

The cover window CW may be disposed on an upper surface of the polarization member POL. For example, the cover window CW may be disposed on an upper surface of the polarization member POL with a second upper coupling member UCM2 therebetween. The cover window CW serves to protect the display panel DP. The cover window CW may be made of a transparent material. The cover window CW may be made of, for example, glass or plastic. In an embodiment, the cover window CW may be made of glass, but the present disclosure is not limited thereto.

The cover window protection layer CWP may be disposed on an upper surface of the cover window CW. For example, the cover window protection layer CWP may be disposed on an upper surface of the cover window CW with a first upper coupling member UCM1 therebetween. The cover window protection layer CWP may be implemented as, for example, a transparent polymer film including at least one selected from among polyethylene terephthalate (PET), polyethylene naphthalate (PEN), PI, polyarylate (PAR) polycarbonate (PC), polymethylmethacrylate (PMMA), and a cycloolefin polymer (COP) resin.

The upper stack structure US may include upper coupling members (e.g., a first upper coupling member UCM1, a second upper coupling member UCM2, and a third upper coupling member UCM3) which couple adjacent stacked members to each other. The upper coupling members UCM1, UCM2, and UCM3 may be optically transparent. The upper coupling members UCM1, UCM2, and UCM3 may include an optically transparent adhesive, an optically transparent resin, a pressure sensitive adhesive, and the like. In an embodiment, a first upper coupling member UCM1 may be disposed between the cover window protection layer CWP and the cover window CW to couple the cover window protection layer CWP and the cover window CW to each other, a second upper coupling member UCM2 may be disposed between the cover window CW and the polarization member POL to couple the cover window CW and the polarization member POL to each other, and a third upper coupling member UCM3 may be disposed between the polarization member POL and the display panel DP to couple the polarization member POL and the display panel DP to each other.

The lower stack structure LS may include a polymer film layer PF, a cover panel CPNL, a functional layer FL, and a support member SM which are stacked (e.g., sequentially stacked) downward from the display panel DP.

The polymer film layer PF may be disposed on the lower surface of the display panel DP. For example, the polymer film layer PF may be disposed on the lower surface of the display panel DP with a first lower coupling member LCM1 therebetween. The polymer film layer PF may perform a function of protecting the display panel DP. The polymer film layer PF may include PI, PET, PC, polyethylene (PE), polypropylene (PP), polysulfone (PSF), PMMA, tri-acetyl cellulose (TAC), COP, or the like.

The cover panel CPNL may be disposed on a lower surface of the polymer film layer PF. For example, the cover panel CPNL may be disposed on a lower surface of the polymer film layer PF with a second lower coupling member LCM2 therebetween. In an embodiment, the cover panel CPNL may be provided as a plurality of layers, and the plurality of layers may each be made of a rigid material or an elastic material. The cover panel CPNL may perform a function of supporting the display panel DP, a function of reinforcing the rigidity of the display panel DP, a function of buffering an impact applied to the display panel DP, and the like.

The functional layer FL may be disposed on a lower surface of the cover panel CPNL. For example, the functional layer FL may be disposed on a lower surface of the cover panel CPNL with a third lower coupling member LCM3 therebetween. The functional layer FL may include, for example, at least one of a digitizer, an electromagnetic wave-shielding layer, an impact absorption layer, and a heat dissipation layer. In an embodiment, the functional layer FL may be included in the cover panel CPNL or may be omitted.

As shown in FIG. 3, portions of the functional layer FL may be disposed to be separated from or spaced from each other with the folding area FA interposed therebetween. For example, the functional layer FL may not be present in the folding area FA. In an embodiment, portions of the functional layer FL facing each other with the folding area FA interposed therebetween may define a space in the folding area FA as shown in FIG. 3. However, the present disclosure is not limited thereto. For example, the functional layer FL may be provided as a plurality of layers, and one or more of the plurality of layers of the functional layer FL may be integrally disposed in the first non-folding area NFA1, the folding area FA, and the second non-folding area NFA2. In addition, one or more of the plurality of layers may be disposed between the cover panel CPNL and the display panel DP.

The support member SM may be disposed on a lower surface of the functional layer FL. For example, the support member SM may be disposed on a lower surface of the functional layer FL with a fourth lower coupling member LCM4 therebetween. The support member SM may perform a function of supporting members on (e.g., stacked on) an upper surface of the support member SM. The support member SM may include a metal. The support member SM may serve as a heat dissipation member that discharges heat generated from the display device 1 to the outside.

As shown in FIG. 3, the support member SM may be integrally disposed throughout the first non-folding area NFA1, the folding area FA, and the second non-folding area NFA2, but the present disclosure is not limited thereto. For example, the support member SM may be provided as a plurality of layers, and one or more of the plurality of layers may be disposed to be separated from each other with the folding area FA interposed therebetween. In an embodiment, the support member SM and the portions of the functional layer FL facing each other with the folding area FA interposed therebetween may define a space in the folding area FA as shown in FIG. 3.

When members disposed on the lower surface of the display panel DP, such as the cover panel CPNL or the functional layer FL, are disposed to be separated from each other with the folding area FA interposed therebetween, a gap (or a space) may be formed in the folding area FA, and a foreign material may permeate through the gap. The above-described permeation of the foreign material may be blocked by a foreign material blocking member MF (e.g., see FIG. 5) of the support member SM to be described in more detail below.

The lower stack structure LS may further include lower coupling members (e.g., a first lower coupling member LCM1, a second lower coupling member LCM2, a third lower coupling member LCM3, and a fourth lower coupling member LCM4) which couple adjacent stacked members to each other. For example, a first lower coupling member LCM1 may be disposed between the display panel DP and the polymer film layer PF to couple the display panel DP and the polymer film layer PF to each other, a second lower coupling member LCM2 may be disposed between the polymer film layer PF and the cover panel CPNL to couple the polymer film layer PF and the cover panel CPNL to each other, a third lower coupling member LCM3 may be disposed between the cover panel CPNL and the functional layer FL to couple the cover panel CPNL and the functional layer FL to each other, and a fourth lower coupling member LCM4 may be disposed between the functional layer FL and the support member SM to couple the functional layer FL and the support member SM to each other.

Hereinafter, the support member SM will be described in more detail with reference to FIGS. 5 to 8.

Figure 5:
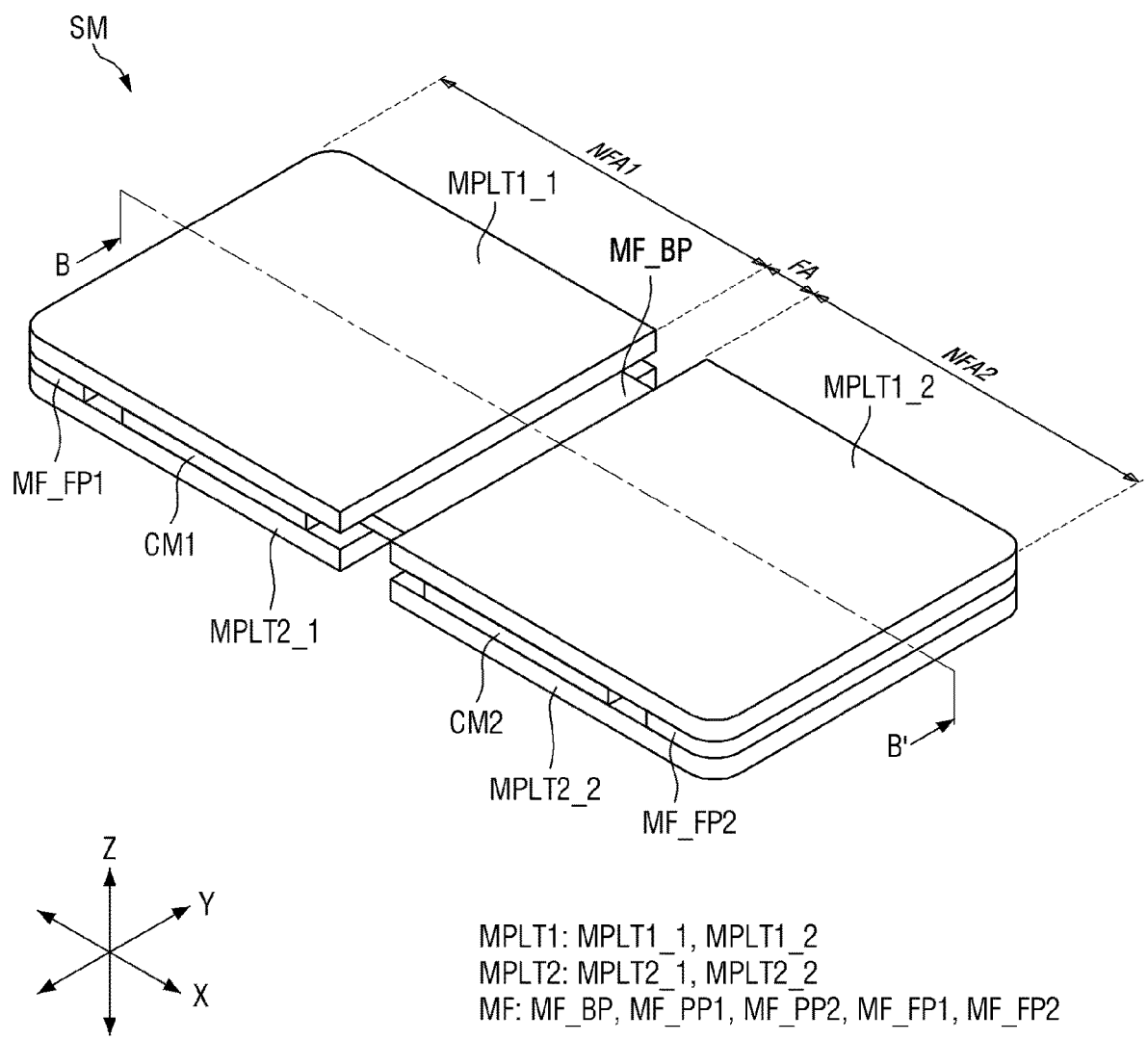
FIG. 5 is a perspective view of a support member according to an embodiment.
Figure 6:
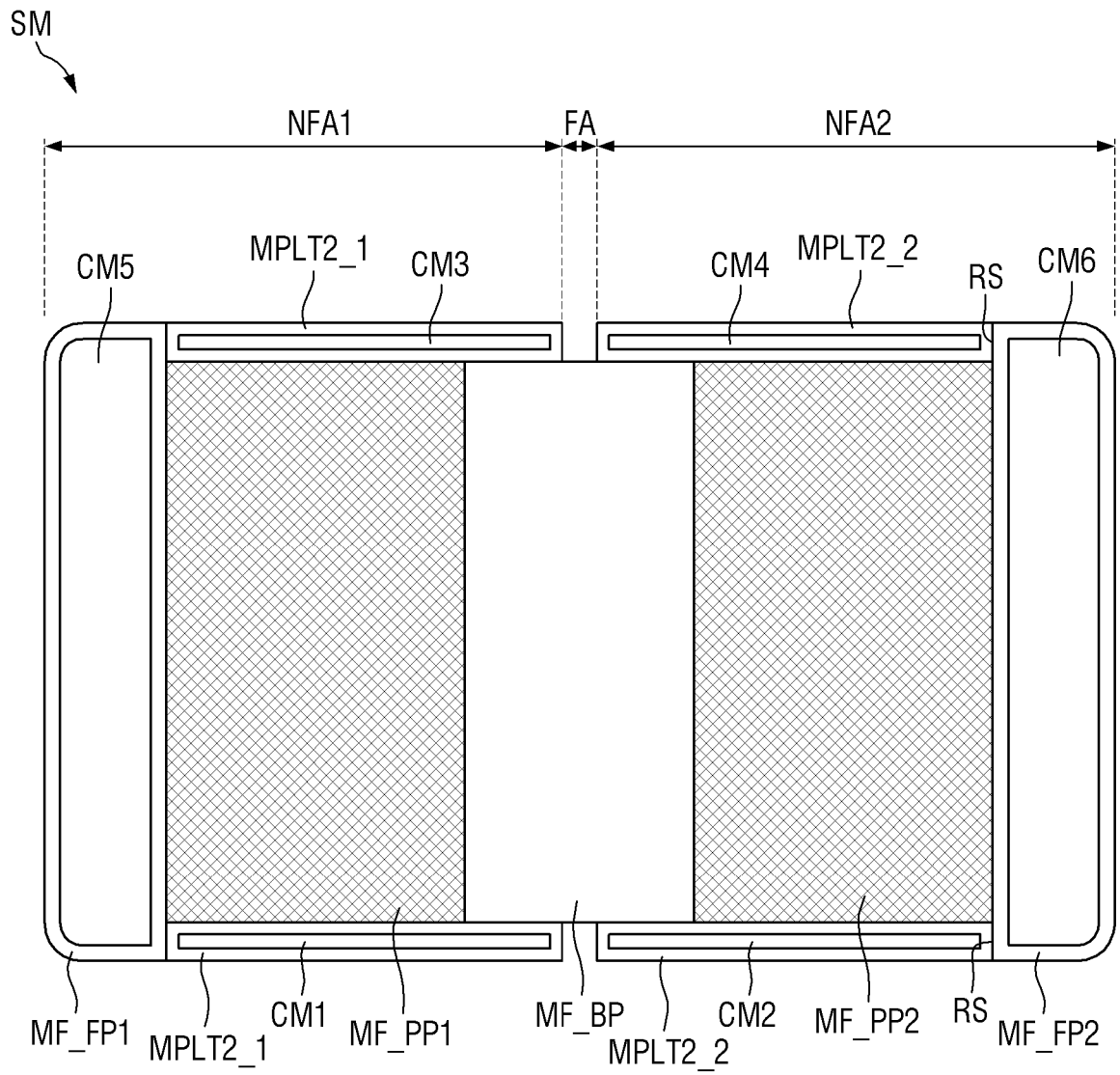
FIG. 6 is a plan view of the support member according to an embodiment.
Figure 7:
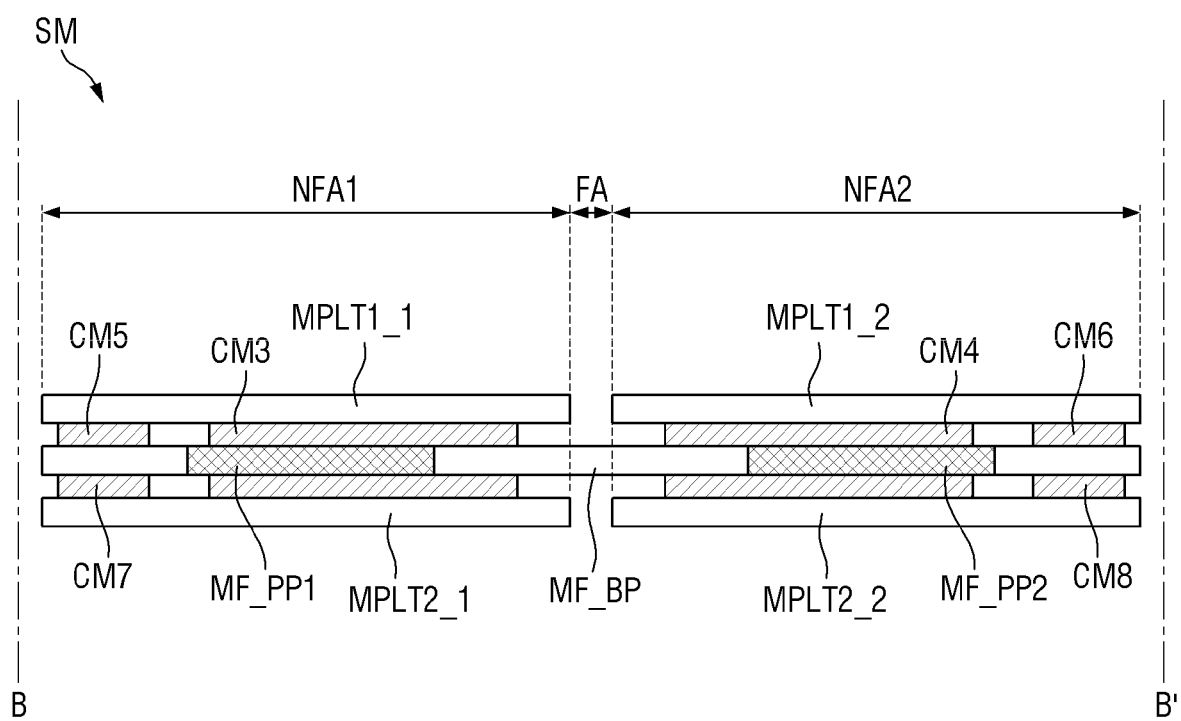
FIG. 7 is a cross-sectional view taken along the line B-B' of FIG. 5.
Figure 8:
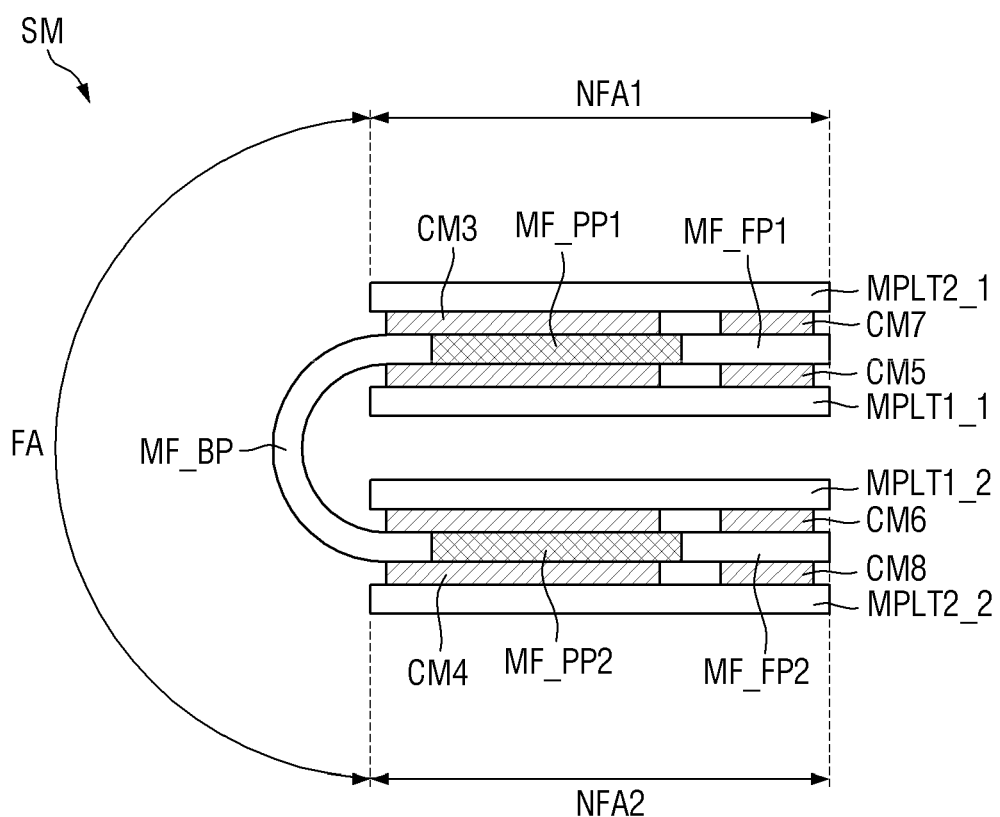
FIG. 8 is a cross-sectional view of the support member in a folded state according to an embodiment.
Figure 8:
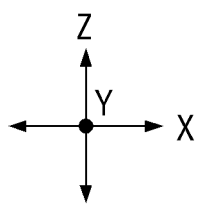

FIG. 5 is a perspective view of a support member according to an embodiment. FIG. 6 is a plan view of the support member according to an embodiment. FIG. 7 is a cross-sectional view taken along the line B-B' of FIG. 5. FIG. 8 is a cross-sectional view of the support member in a folded state according to an embodiment.

For convenience of description, the illustration of an upper support member MPLT1 is omitted in FIG. 6.

Referring to FIGS. 5 and 6, a support member SM may include the upper support member MPLT1, a lower support member MPLT2, and a foreign material blocking member MF.

The upper support member MPLT1 may be disposed on an upper surface of the foreign material blocking member MF, and the lower support member MPLT2 may be disposed on a lower surface of the foreign material blocking member MF.

Further referring to FIG. 3, the upper support member MPLT1 may be attached onto a lower surface of a cover panel CPNL or a lower surface of a functional layer FL by a fourth lower coupling member LCM4. The functional layer FL may be a digitizer or an electromagnetic wave-shielding layer.

The upper support member MPLT1 may include a first upper support member MPLT1_1 and a second upper support member MPLT1_2.

The first upper support member MPLT1_1 and the second upper support member MPLT1_2 may be disposed to be separated from or spaced from each other based on a folding area FA. The first upper support member MPLT1_1 may be in (e.g., mainly disposed in) a first non-folding area NFA1, and the second upper support member MPLT1_2 may be in (e.g., mainly disposed in) a second non-folding area NFA2.

The lower support member MPLT2 may include a first lower support member MPLT2_1 and a second lower support member MPLT2_2.

The first lower support member MPLT2_1 and the second lower support member MPLT2_2 may be disposed to be separated from or spaced from each other based on the folding area FA. The first lower support member MPLT2_1 may be in (e.g., mainly disposed in) the first non-folding area NFA1, and the second lower support member MPLT2_2 may be in (e.g., mainly disposed in) the second non-folding area NFA2.

The first upper support member MPLT1_1, the second upper support member MPLT1_2, the first lower support member MPLT2_1, and the second lower support member MPLT2_2 may each be formed as a plate-shaped member and may have an approximately rectangular shape in a plan view. However, the present disclosure is not limited thereto. For example, the first upper support member MPLT1_1, the second upper support member MPLT1_2, the first lower support member MPLT2_1, and the second lower support member MPLT2_2 may be any suitable shape.

The first upper support member MPLT1_1 and the second upper support member MPLT1_2 may be disposed to have symmetrical shapes based on the folding area FA, and the first lower support member MPLT2_1 and the second lower support member MPLT2_2 may also be disposed to have symmetrical shapes based on the folding area FA, but the present disclosure is not limited thereto.

Edges of the first upper support member MPLT1_1, the second upper support member MPLT1_2, the first lower support member MPLT2_1, and the second lower support member MPLT2_2 may be aligned at boundaries of the first non-folding area NFA1 and the second non-folding area NFA2, but the present disclosure is not limited thereto. The first upper support member MPLT1_1, the second upper support member MPLT1_2, the first lower support member MPLT2_1, and the second lower support member MPLT2_2 may each be disposed in the first non-folding area NFA1 and the second non-folding area NFA2 or may be disposed such that a portion thereof is in the folding area FA.

The first upper support member MPLT1_1 and the first lower support member MPLT2_1 may have the same shape in a plan view to overlap (e.g., completely overlap) each other, and the second upper support member MPLT1_2 and the second lower support member MPLT2_2 may have the same shape in a plan view to overlap (e.g., completely overlap) each other, but the present disclosure is not limited thereto. The first lower support member MPLT2_1 and the second lower support member MPLT2_2 may have shapes and sizes different from those of the first upper support member MPLT1_1 and the second upper support member MPLT1_2, respectively.

Further referring to FIGS. 7 and 8, the first lower support member MPLT2_1 may overlap the first upper support member MPLT1_1 in a thickness direction of the first upper support member MPLT1_1, and the second lower support member MPLT2_2 may overlap the second upper support member MPLT1_2 in a thickness direction of the second upper support member MPLT1_2.

The first upper support member MPLT1_1, the second upper support member MPLT1_2, the first lower support member MPLT2_1, and the second lower support member MPLT2_2 may include a metal. In an embodiment, the first upper support member MPLT1_1, the second upper support member MPLT1_2, the first lower support member MPLT2_1, and the second lower support member MPLT2_2 may each be a metal plate or metal film. The metal may be a metal having excellent thermal conductivity, such as copper, nickel, ferrite, or silver.

In FIGS. 5 to 8, the upper support member MPLT1 may be a member separate and different from other members on (e.g., stacked on) a lower surface of a display panel DP, for example, a polymer film layer PF, the cover panel CPNL, and the functional layer FL, but the present disclosure is not limited thereto. For example, the upper support member MPLT1 may include members stacked between the display panel DP and the foreign material blocking member MF, such as the polymer film layer PF, the cover panel CPNL, and the functional layer FL.

As shown in FIGS. 5, 7, and 8, the first upper support member MPLT1_1 and the second upper support member MPLT1_2 may be disposed to be spaced from each other by a set distance (e.g., a predetermined distance) in a first direction X, and the first lower support member MPLT2_1 and the second lower support member MPLT2_2 may be disposed to be spaced from each other by a set distance (e.g., a predetermined distance) in a first direction X. Gaps having a slit shape elongated in a second direction Y may be formed between the first upper support member MPLT1_1 and the second upper support member MPLT1_2 and between the first lower support member MPLT2_1 and the second lower support member MPLT2_2. The gaps may be formed in the folding area FA. The gaps may at least partially overlap the folding area FA in a thickness direction (e.g., a thickness direction of the display panel DP).

A width (e.g., a width in the first direction X) of the gap between the first upper support member MPLT1_1 and the second upper support member MPLT1_2 may be substantially the same as a width (e.g., a width in the first direction X) of the gap between the first lower support member MPLT2_1 and the second lower support member MPLT2_2 but is not limited thereto. In an embodiment, the width of the gap between the first upper support member MPLT1_1 and the second upper support member MPLT1_2 may be different from the width of the gap between the first lower support member MPLT2_1 and the second lower support member MPLT2_2. For example, the width of the gap between the first upper support member MPLT1_1 and the second upper support member MPLT1_2 may be smaller than the width of the gap between the first lower support member MPLT2_1 and the second lower support member MPLT2_2.

In an embodiment, the upper support member MPLT1 may further include a connection member disposed in the folding area FA to connect the first upper support member MPLT1_1 and the second upper support member MPLT1_2. Similarly, in an embodiment, the lower support member MPLT2 may further include a connection member disposed in the folding area FA to connect the first lower support member MPLT2_1 and the second lower support member MPLT2_2. A pattern for mitigating rigidity may be formed on the connection members.

The lower support member MPLT2 may have the same thickness as the upper support member MPLT1, but the present disclosure is not limited thereto. For example, the thickness of the lower support member MPLT2 may be smaller than the thickness of the upper support member MPLT1.

Referring again to FIGS. 5 and 6, the foreign material blocking member MF may be disposed between the upper support member MPLT1 and the lower support member MPLT2. The foreign material blocking member MF may be disposed throughout the first non-folding area NFA1, the folding area FA, and the second non-folding area NFA2.

The foreign material blocking member MF may be made of a material having flexibility. The foreign material blocking member MF may include a plastic material such as PE, PP, polystyrene, PET, PI, polyester, polyvinyl chloride, polyurethane, PC, or polyvinylidene chloride. The foreign material blocking member MF may be implemented as, for example, a thin film-type member that is made of PET and has a thickness of about 50 µm to about 80 µm, but the present disclosure is not limited thereto.

The foreign material blocking member MF may include a blocking part MF_BP, a first stretchable part MF_PP1, a second stretchable part MF_PP2, a first fixing part MF_FP1, and a second fixing part MF_FP2.

The foreign material blocking member MF may be divided into a plurality of areas according to whether a pattern to be described in more detail below is disposed. For example, the blocking part MF_BP, the first fixing part MF_FP1, and the second fixing part MF_FP2 may be a first non-pattern area, a second non-pattern area, and a third non-pattern area, respectively, and the first stretchable part MF_PP1 and the second stretchable part MF_PP2 may be a first pattern area and a second pattern area, respectively.

The blocking part MF_BP may be in (e.g., mainly disposed in) the folding area FA. In an embodiment, a width of the blocking part MF_BP in the first direction X may be greater than a width of the folding area FA in the first direction X. In this case, opposite sides of the blocking part MF_BP may be disposed in the first non-folding area NFA1 and the second non-folding area NFA2 respectively. The blocking part MF_BP may overlap a portion of the first non-folding area NFA1, the folding area FA, and a portion of the second non-folding area NFA2 in a thickness direction of the blocking part MF_BP. A side of the blocking part MF_BP positioned in the first non-folding area NFA1 may be connected to the first stretchable part MF_PP1, and another side of the blocking part MF_BP positioned in the second non-folding area NFA2 may be connected to the second stretchable part MF_PP2.

The width of the blocking part MF_BP in the first direction X may be greater than the width of the gap between the first upper support member MPLT1_1 and the second upper support member MPLT1_2 in the first direction X and/or the width of the gap between the first lower support member MPLT2_1 and the second lower support member MPLT2_2 in the first direction X. The width of the gap between the first upper support member MPLT1_1 and the second upper support member MPLT1_2 in the first direction X and the width of the gap between the first lower support member MPLT2_1 and the second lower support member MPLT2_2 in the first direction X may refer to a distance between the first upper support member MPLT1_1 and the second upper support member MPLT1_2 in the first direction X and a distance between the first lower support member MPLT2_1 and the second lower support member MPLT2_2 in the first direction X, respectively.

The blocking part MF_BP may be disposed to cross the first upper support member MPLT1_1 and the second upper support member MPLT1_2, and the blocking part MF_BP may be disposed to cross the first lower support member MPLT2_1 and the second lower support member MPLT2_2. The blocking part MF_BP may overlap a portion of the first upper support member MPLT1_1 a portion of the second upper support member MPLT1_2 in a thickness direction of the blocking part MF_BP, and the blocking part MF_BP may overlap a portion of the first lower support member MPLT2_1 and a portion of the second lower support member MPLT2_2 in a thickness direction of the blocking part MF_BP.

The blocking part MF_BP may be disposed to overlap the gap between the first upper support member MPLT1_1 and the second upper support member MPLT1_2 and the gap between the first lower support member MPLT2_1 and the second lower support member MPLT2_2 in the thickness direction of the blocking part MF_BP. In an embodiment the blocking part MF_BP may be between the gap between the first upper support member MPLT1_1 and the second upper support member MPLT1_2 and the gap between the first lower support member MPLT2_1 and the second lower support member MPLT2_2. The blocking part MF_BP may cover the gap between the first upper support member MPLT1_1 and the second upper support member MPLT1_2, and the gap between the first lower support member MPLT2_1 and the second lower support member MPLT2_2. When a display device 1 is folded and unfolded, the blocking part MF_BP may block a foreign material from permeating into the display device 1 from the outside through the gaps.

Further referring to FIGS. 2 and 8, when the display device 1 is folded, at least a portion of the blocking part MF_BP may be bent to have an approximately "C"-shaped cross section.

Referring again to FIGS. 5 and 6, the first stretchable part MF_PP1 may be disposed at a side of the blocking part MF_BP, and the second stretchable part MF_PP2 may be disposed at another side of the blocking part MF_BP. In FIG. 6, the side of the blocking part MF_BP may be a left side of the blocking part MF_BP, and the other side of the blocking part MF_BP may be a right side of the blocking part MF_BP. In other words, the first stretchable part MF_PP1 and the second stretchable part MF_PP2 may be disposed at respective, opposite sides of the blocking part MF_BP.

The first stretchable part MF_PP1 and the second stretchable part MF_PP2 may be disposed in the first non-folding area NFA1 and the second non-folding area NFA2, respectively. In an embodiment, a portion of the first stretchable part MF_PP1 and a portion of the second stretchable part MF_PP2 may each be disposed in the folding area FA.

The first stretchable part MF_PP1 may be disposed between the blocking part MF_BP and the first fixing part MF_FP1, and the second stretchable part MF_PP2 may be disposed between the blocking part MF_BP and the second fixing part MF_FP2. The first stretchable part MF_PP1 may connect the blocking part MF_BP and the first fixing part MF_FP1, and the second stretchable part MF_PP2 may connect the blocking part MF_BP and the second fixing part MF_FP2. Specifically, a side of the first stretchable part MF_PP1 may be connected to a side of the blocking part MF_BP, and another side of the first stretchable part MF_PP1 may be connected to the first fixing part MF_FP1. A side of the second stretchable part MF_PP2 may be connected to another side of the blocking part MF_BP, and another side of the second stretchable part MF_PP2 may be connected to the second fixing part MF_FP2. In an embodiment, the side of the first stretchable part MF_PP1 and the other side of the first stretchable part MF_PP1 may be opposite to each other, and the side of the second stretchable part MF_PP2 and the other side of the second stretchable part MF_PP2 may be opposite to each other.

Further referring to FIGS. 2, 7 and 8, patterns for increasing a strain rate with respect to stress applied to the first and second stretchable parts MF_PP1 and MF_PP2 may be formed in the first and second stretchable parts MF_PP1 and MF_PP2. Because the first stretchable part MF_PP1 and the second stretchable part MF_PP2 have a strain rate greater than that of the blocking part MF_BP, the first fixing part MF_FP1, and the second fixing part MF_FP2, when the display device 1 is folded and unfolded, the first stretchable part MF_PP1 and the second stretchable part MF_PP2 may be stretched and compressed in a direction that intersects and/or is perpendicular to a thickness direction thereof. The pattern may be, for example, a mesh pattern including a plurality of openings OP (e.g., see FIG. 9), but the present disclosure is not limited thereto.

The first fixing part MF_FP1 may be disposed at a side of the blocking part MF_BP, and the second fixing part MF_FP2 may be disposed at another side of the blocking part MF_BP. The first fixing part MF_FP1 and the second fixing part MF_FP2 may be disposed to be spaced from the blocking part MF_BP. In FIG. 6, one side of the blocking part MF_BP may be the left side of the blocking part MF_BP, and the other side of the blocking part MF_BP may be the right side of the blocking part MF_BP. In other words, the side of the blocking part MF_BP and the other side of the blocking part MF_BP may be opposite to each other.

The first fixing part MF_FP1 and the second fixing part MF_FP2 may be disposed in the first non-folding area NFA1 and the second non-folding area NFA2, respectively. The first fixing part MF_FP1 and the second fixing part MF_FP2 may be disposed to be further spaced from the blocking part MF_BP than the first stretchable part MF_PP1 and the second stretchable part MF_PP2 may be spaced from the blocking part MF_BP, respectively. The first fixing part MF_FP1 and the second fixing part MF_FP2 may be disposed closer to the edges (e.g., outer edges) of the support member SM than the first stretchable part MF_PP1 and the second stretchable part MF_PP2 may be to the edges of the support member SM, respectively.

The first fixing part MF_FP1 and the second fixing part MF_FP2 may be fixed to the upper support member MPLT1 and the lower support member MPLT2. The first fixing part MF_FP1 and the second fixing part MF_FP2 may refer to parts which are attached to corresponding portions (e.g., the first upper support member MPLT1_1 or the second upper support member MPLT1_2) of the upper support member MPLT1 and corresponding portions (e.g., the first lower support member MPLT2_1 or the second lower support member MPLT2_2) of the lower support member MPLT2 so that positions of the first fixing part MF_FP1 and the second fixing part MF_FP2 relative to the corresponding portions of the upper support member MPLT1 and the corresponding portions of the lower support member MPLT2 do not change when the display device 1 is unfolded and folded.

On the contrary, the blocking part MF_BP, the first stretchable part MF_PP1, and the second stretchable part MF_PP2 may be coupled to the upper support member MPLT1 and the lower support member MPLT2 so that positions of the blocking part MF_BP, the first stretchable part MF_PP1, and the second stretchable part MF_PP2 relative to the upper support member MPLT1 and the lower support member MPLT2 may change when the display device 1 is unfolded and folded.

Referring to FIG. 6, the blocking part MF_BP, the first stretchable part MF_PP1, the second stretchable part MF_PP2, the first fixing part MF_FP1, and the second fixing part MF_FP2 may have an approximately rectangular shape in a plan view, but the present disclosure is not limited thereto. For example, the blocking part MF_BP, the first stretchable part MF_PP1, the second stretchable part MF_PP2, the first fixing part MF_FP1, and the second fixing part MF_FP2 may have any suitable shape.

The first stretchable part MF_PP1 and the second stretchable part MF_PP2 may have an area greater than that of the blocking part MF_BP, the first fixing part MF_FP1, and the second fixing part MF_FP2 in a plan view. The blocking part MF_BP may have an area greater than that of the first fixing part MF_FP1 and the second fixing part MF_FP2 in a plan view.

The blocking part MF_BP, the first stretchable part MF_PP1, the second stretchable part MF_PP2, the first fixing part MF_FP1, and the second fixing part MF_FP2 may have different widths in the first direction X. In this case, the blocking part MF_BP, the first stretchable part MF_PP1, the second stretchable part MF_PP2, the first fixing part MF_FP1, and the second fixing part MF_FP2 may have approximately the same width in the second direction Y, but the present disclosure is not limited thereto.

Specifically, the width of the first stretchable part MF_PP1 and the second stretchable part MF_PP2 in the first direction X may be greater than that of the blocking part MF_BP, the first fixing part MF_FP1, and the second fixing part MF_FP2. The width of the blocking part MF_BP in the first direction X may be greater than that of the first fixing part MF_FP1 and the second fixing part MF_FP2. Accordingly, the blocking part MF_BP may cover (e.g., sufficiently cover) the gap formed between the first upper member and the second upper member and the blocking part MF_BP may cover (e.g., sufficiently cover) the gap formed between the first lower member and the second lower member, and a strain amount per unit area (or unit length) of the first and second stretchable parts MF_PP1 and MF_PP2 may be relatively reduced so that the durability of the first and second stretchable parts MF_PP1 and MF_PP2 may be improved. In addition, an amount of torque to fold and unfold the display device 1 may also be reduced, thereby enabling folding and unfolding (e.g., smooth folding and unfolding).

However, the size relationship and/or area relationship between the blocking part MF_BP, the first stretchable part MF_PP1, the second stretchable part MF_PP2, the first fixing part MF_FP1, and the second fixing part MF_FP2 are not limited to the above examples and may be variously changed in a suitable manner according to a design of the display device 1 according to one or more embodiments of the present disclosure.

Referring to FIG. 6, the foreign material blocking member MF may further include recessed portions RS.

The recessed portions RS may be disposed at both sides of the foreign material blocking member MF extending in the first direction X. The recessed portion RS may be disposed to cross a portion of the first non-folding area NFA1, the folding area FA, and a portion of the second non-folding area NFA2. The recessed portion RS may be disposed between the upper support member MPLT1 and the lower support member MPLT2.

The recessed portion RS may have a shape recessed from an edge of the foreign material blocking member MF toward the inside of the foreign material blocking member MF in a plan view. In this case, the width of the first fixing part MF_FP1 and the second fixing part MF_FP2 in the second direction Y may be greater than that of the blocking part MF_BP, the first stretchable part MF_PP1, and the second stretchable part MF_PP2, and the blocking part MF_BP, the first stretchable part MF_PP1, and the second stretchable part MF_PP2 may have approximately the same width in the second direction Y. The recessed portions RS may provide spaces in which coupling members to be described in more detail below are disposed. In an embodiment, the recessed portion RS may be formed to have "L"-shaped corners in a plan view, but the present disclosure is not limited thereto.

Referring to FIGS. 5 to 8, the support member SM may further include a first coupling member CM1, a second coupling member CM2, a third coupling member CM3, and a fourth coupling member CM4 which couple the upper support member MPLT1 and the lower support member MPLT2.

The first coupling member CM1 and the second coupling member CM2 may be symmetrically disposed based on the folding area FA. Similarly, the third coupling member CM3 and the fourth coupling member CM4 may be symmetrically disposed based on the folding area FA.

The first coupling member CM1 and the third coupling member CM3 may be disposed in the first non-folding area NFA1. The first coupling member CM1 and the third coupling member CM3 may be interposed between the first upper support member MPLT1_1 and the first lower support member MPLT2_1 to couple the first upper support member MPLT1_1 and the first lower support member MPLT2_1 to each other. The first coupling member CM1 and the third coupling member CM3 may block a foreign material from permeating through the first upper support member MPLT1_1 and the first lower support member MPLT2_1.

The first coupling member CM1 and the third coupling member CM3 may each have a rectangular shape elongated in the first direction X in a plan view, but the present disclosure is not limited thereto. For example, the first coupling member CM1 and the third coupling member CM3 may be any suitable shape. The first coupling member CM1 and the third coupling member CM3 may be disposed along (e.g., adjacent to) respective, opposite sides of the first stretchable part MF_PP1 extending in the first direction X. The first coupling member CM1 and the third coupling member CM3 may be symmetrically disposed based on the first stretchable part MF_PP1, but the present disclosure is not limited thereto.

The first coupling member CM1 and the third coupling member CM3 may overlap the first stretchable part MF_PP1 in the second direction Y. A side of each of the first coupling member CM1 and the third coupling member CM3 adjacent to the folding area FA may overlap a portion of the blocking part MF_BP disposed in the first non-folding area NFA1 in the second direction Y.

The second coupling member CM2 and the fourth coupling member CM4 may be disposed in the second non-folding area NFA2. The second coupling member CM2 and the fourth coupling member CM4 may be interposed between the second upper support member MPLT1_2 and the second lower support member MPLT2_2 to couple the second upper support member MPLT1_2 and the second lower support member MPLT2_2 to each other. The second coupling member CM2 and the fourth coupling member CM4 may block a foreign material from permeating through the second upper support member MPLT1_2 and the second lower support member MPLT2_2.

The second coupling member CM2 and the fourth coupling member CM4 may each have a rectangular shape elongated in the first direction X in a plan view, but the present disclosure is not limited thereto. For example, the second coupling member CM2 and the fourth coupling member CM4 may have any suitable shape. The second coupling member CM2 and the fourth coupling member CM4 may be disposed along (e.g., adjacent to) respective, opposite sides of the second stretchable part MF_PP2 extending in the first direction X. The second coupling member CM2 and the fourth coupling member CM4 may be symmetrically disposed based on the second stretchable part MF_PP2, but the present disclosure is not limited thereto.

The second coupling member CM2 and the fourth coupling member CM4 may overlap the second stretchable part MF_PP2 in the second direction Y. A side of each of the second coupling member CM2 and the fourth coupling member CM4 adjacent to the folding area FA may overlap a portion of the blocking part MF_BP disposed in the second non-folding area NFA2 in the second direction Y.

The first coupling member CM1, the second coupling member CM2, the third coupling member CM3, and/or the fourth coupling member CM4 may each include an adhesive member for bonding the upper support member MPLT1 and the lower support member MPLT2 to each other. The adhesive member may be, for example, adhesive tape but is not limited thereto.

The first coupling member CM1, the second coupling member CM2, the third coupling member CM3, and the fourth coupling member CM4 may be disposed in the recessed portions RS. Specifically, the first coupling member CM1 and the second coupling member CM2 may be disposed in the recessed portion RS provided at a side of the foreign material blocking member MF extending in the first direction X. The second coupling member CM2 and the fourth coupling member CM4 may be disposed in the recessed portion RS provided at another side of the foreign material blocking member MF extending in the first direction X. For example, the side and the other side of the foreign material blocking member MF may be a lower edge and an upper edge of FIG. 11, respectively. In other words, the side of foreign material blocking member MF and the other side of the foreign material blocking member MF may be opposite to each other.

The support member SM may further include a fifth coupling member CM5 and a sixth coupling member CM6 which couple the foreign material blocking member MF and the upper support member MPLT1 to each other and a seventh coupling member CM7 and an eighth coupling member CM8 which couple the foreign material blocking member MF and the lower support member MPLT2 to each other.

The fifth coupling member CM5 and the sixth coupling member CM6 may each have a rectangular shape elongated in the first direction X in a plan view, but the present disclosure is not limited thereto. For example, the fifth coupling member CM5 and the sixth coupling member CM6 may be any suitable shape. In an embodiment, the seventh coupling member CM7 and the eighth coupling member CM8 may also have substantially the same or similar shapes as the fifth coupling member CM5 and the sixth coupling member CM6, respectively.

The fifth coupling member CM5 and the sixth coupling member CM6 may be disposed to cover (e.g., cover most) of the first fixing part MF_FP1 and cover (e.g., cover most) of the second fixing part MF_FP2 in a plan view, respectively. The remaining area of the first fixing part MF_FP1 in which the fifth coupling member CM5 is not disposed may be smaller than that of the fifth coupling member CM5. Similarly, the remaining area of the second fixing part MF_FP2 in which the sixth coupling member CM6 is not disposed may be smaller than that of the sixth coupling member CM6. For example, the fifth coupling member CM5 and the sixth coupling member CM6 may be disposed to cover about 80% of the first fixing part MF_FP1 and about 80% of the second fixing part MF_FP2 in a plan view, respectively, but the present disclosure is not limited thereto. In an embodiment, the seventh coupling member CM7 and the eighth coupling member CM8 may be disposed to cover (e.g., cover most) of the first fixing part MF_FP1 and cover (e.g., cover most) of the second fixing part MF_FP2 in a plan view, respectively. Accordingly, a sufficient coupling force may be secured between the foreign material blocking member MF and the upper support member MPLT1 and between the foreign material blocking member MF and the lower support member MPLT2.

The fifth coupling member CM5 and the seventh coupling member CM7 may be disposed on an upper surface of the first fixing part MF_FP1 and a lower surface of the first fixing part MF_FP1, respectively. The fifth coupling member CM5 may be interposed between the first fixing part MF_FP1 and the first upper support member MPLT1_1, and the seventh coupling member CM7 may be interposed between the first fixing part MF_FP1 and the first lower support member MPLT2_1. The fifth coupling member CM5 and the seventh coupling member CM7 may be symmetrically disposed based on the first fixing part MF_FP1, but the present disclosure is not limited thereto.

The sixth coupling member CM6 and the eighth coupling member CM8 may be disposed on an upper surface of the second fixing part MF_FP2 and a lower surface of the second fixing part MF_FP2, respectively. The sixth coupling member CM6 may be interposed between the second fixing part MF_FP2 and the second upper support member MPLT1_2, and the eighth coupling member CM8 may be interposed between the second fixing part MF_FP2 and the second lower support member MPLT2_2. The sixth coupling member CM6 and the eighth coupling member CM8 may be symmetrically disposed based on the second fixing part MF_FP2, but the present disclosure is not limited thereto.

A thickness of each of the fifth coupling member CM5, the sixth coupling member CM6, the seventh coupling member CM7, and the eighth coupling member CM8 may be smaller than that of the foreign material blocking member MF. For example, the fifth coupling member CM5, the sixth coupling member CM6, the seventh coupling member CM7, and the eighth coupling member CM8 may have a thickness of about 8 μm, but the present disclosure is not limited thereto.

The fifth coupling member CM5, the sixth coupling member CM6, the seventh coupling member CM7, and/or the eighth coupling member CM8 may include adhesive members for bonding the foreign material blocking member MF and the upper support member MPLT1 to each other and adhesive members for bonding the foreign material blocking member MF and the lower support member MPLT2 to each other. The adhesive member may be, for example, a pressure sensitive adhesive but is not limited thereto.

A coupling force (or adhesive force) of the fifth coupling member CM5, the sixth coupling member CM6, the seventh coupling member CM7, and the eighth coupling member CM8 may be different from a coupling force (or adhesive force) of the first coupling member CM1, the second coupling member CM2, the third coupling member CM3, and the fourth coupling member CM4. For example, an adhesive force of the adhesive member applied to the fifth coupling member CM5, the sixth coupling member CM6, the seventh coupling member CM7, and the eighth coupling member CM8 may be greater than an adhesive force of the adhesive member applied to the first coupling member CM1, the second coupling member CM2, the third coupling member CM3, and the fourth coupling member CM4. Accordingly, it is possible to prevent or reduce the deformation and/or separation of the foreign material blocking member MF to which a tensile force or a compressive force is applied during folding.

In an embodiment, the first lower support member MPLT2_1 and the second lower support member MPLT2_2 may be omitted, and the first coupling member CM1, the second coupling member CM2, the third coupling member CM3, the fourth coupling member CM4, the seventh coupling member CM7, and the eighth coupling member CM8, which couple the first and second lower support members MPLT2_1 and MPLT2_2 to the first upper support member MPLT1_1, the second upper support member MPLT1_2, and/or the foreign material blocking member MF, may also be omitted. In this case, the first fixing part MF_FP1 and the second fixing part MF_FP2 of the foreign material blocking member MF may be fixed only to the first upper support member MPLT1_1 and the second upper support member MPLT1_2.

Referring to FIGS. 7 and 8, as described above, each of the first fixing part MF_FP1 and the second fixing part MF_FP2 may be attached and fixed to corresponding portions (e.g., the first upper support member MPLT1_1 or the second upper support member MPLT1_2) of the upper support member MPLT1 and corresponding portions (e.g., the first lower support member MPLT2_1 or the second lower support member MPLT2_2) of the lower support member MPLT2. On the other hand, the blocking part MF_BP, the first stretchable part MF_PP1, and the second stretchable part MF_PP2 may not be directly attached or fixed to the upper support member MPLT1 and the lower support member MPLT2 and thus may move independently from the upper support member MPLT1 and the lower support member MPLT2 in order to compensate for a distance between members changing when the support member SM is folded. In this case, the relative position, the size, and/or the length of the blocking part MF_BP, the first stretchable part MF_PP1, and the second stretchable part MF_PP2 with respect to the upper support member MPLT1 and the lower support member MPLT2 may change.

For example, when the display device 1 is folded, the first stretchable part MF_PP1 and the second stretchable part MF_PP2 may be stretched in a direction intersecting a thickness direction thereof, and a portion of the blocking part MF_BP, which overlaps the upper support member MPLT1 and the lower support member MPLT2 in a thickness direction thereof, may be decreased. When the display device 1 is unfolded, the first stretchable part MF_PP1 and the second stretchable part MF_PP2 may be compressed in the direction intersecting the thickness direction thereof, and a portion of the blocking part MF_BP, which overlaps the upper support member MPLT1 and the lower support member MPLT2 in the thickness direction thereof, may be increased. In this case, the blocking part MF_BP, the first stretchable part MF_PP1, and the second stretchable part MF_PP2 may slide with respect to the first upper support member MPLT1_1 and/or the second upper support member MPLT1_2 in the direction intersecting the thickness direction thereof and with respect to the first lower support member MPLT2_1 and/or second lower support member MPLT2_2 in the direction intersecting the thickness direction thereof. When the display device 1 is folded and unfolded, the blocking part MF_BP, the first fixing part MF_FP1, and the second fixing part MF_FP2 may be stretched and compressed in a direction intersecting a thickness direction thereof similar to the first stretchable part MF_PP1 and the second stretchable part MF_PP2, but a strain amount thereof may be smaller than that of the first stretchable part MF_PP1 and the second stretchable part MF_PP2.

Figure 9A:
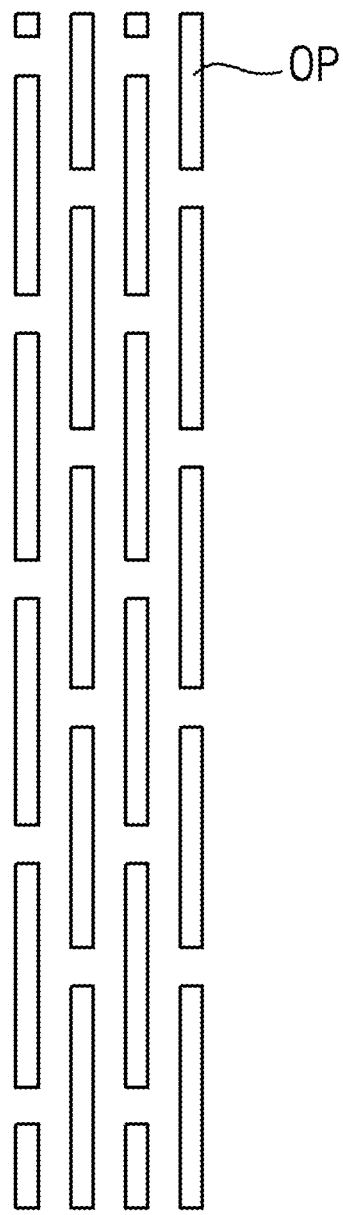
FIGS. 9A, 9B, and 9C show plan views illustrating patterns of a first stretchable part and a second stretchable part according to various embodiments.
Figure 9B:
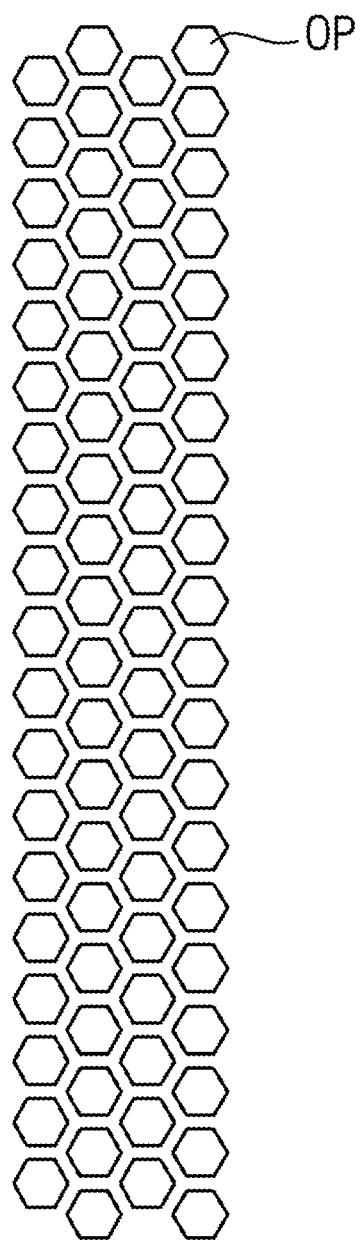
Figure 9C:
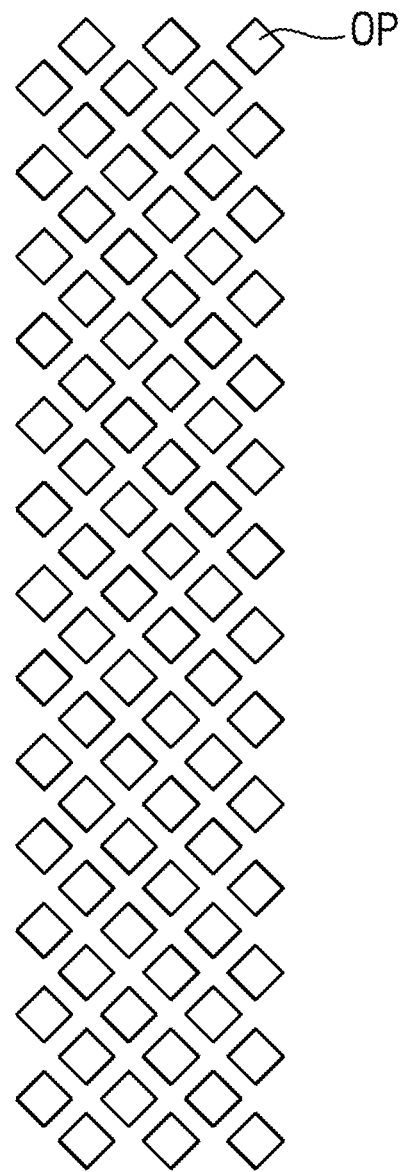

FIGS. 9A, 9B, and 9C show plan views illustrating patterns of a first stretchable part and a second stretchable part according to various embodiments.

As described above, patterns may be disposed on a first stretchable part MF_PP1 and a second stretchable part MF_PP2. The patterns may include a plurality of openings OP for changing the shape of the first stretchable part MF_PP1 and the second stretchable part MF_PP2. A mesh structure may be provided to the first stretchable part MF_PP1 and the second stretchable part MF_PP2 by the plurality of openings OP.

The shape of the opening OP may be variously changed in a suitable manner. For example, as shown in FIG. 9A, the opening OP may have a rectangular shape elongated in a direction in a plan view. Further referring to FIGS. 1 to 6, the direction may be a second direction Y but is not limited thereto. As another example, as shown in FIG. 9B, the opening OP may have a hexagonal shape in a plan view. As still another example, as shown in FIG. 9B, the opening OP may have a square shape in a plan view.

However, the shape of the plurality of openings OP disposed in the first stretchable part MF_PP1 and the second stretchable part MF_PP2 is not limited thereto, and the plurality of openings OP may have various suitable shapes such as a polygonal shape, a circular shape, and an elliptical shape.

Figure 10:
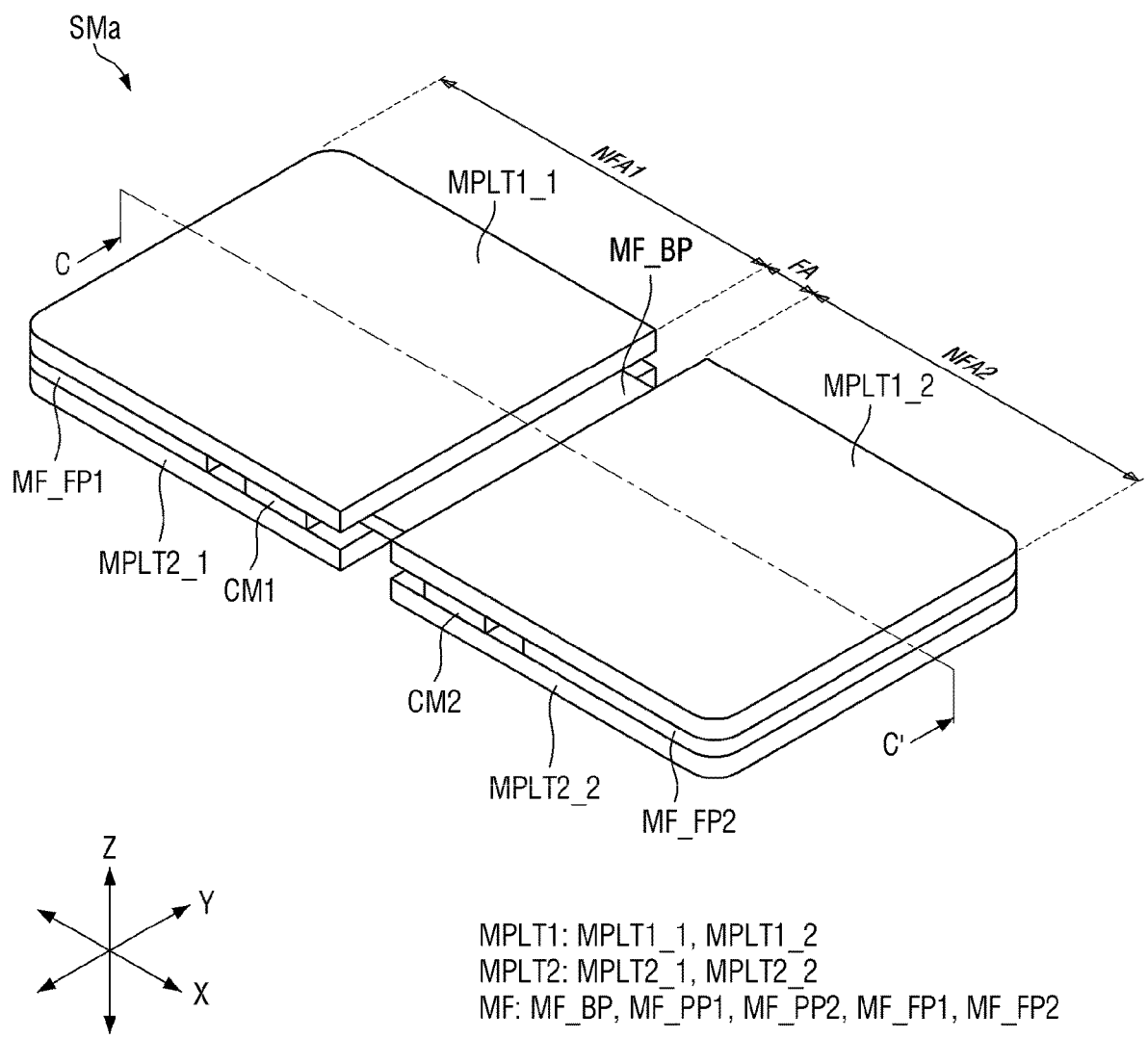
FIG. 10 is a perspective view of a support member according to an embodiment.
Figure 11:
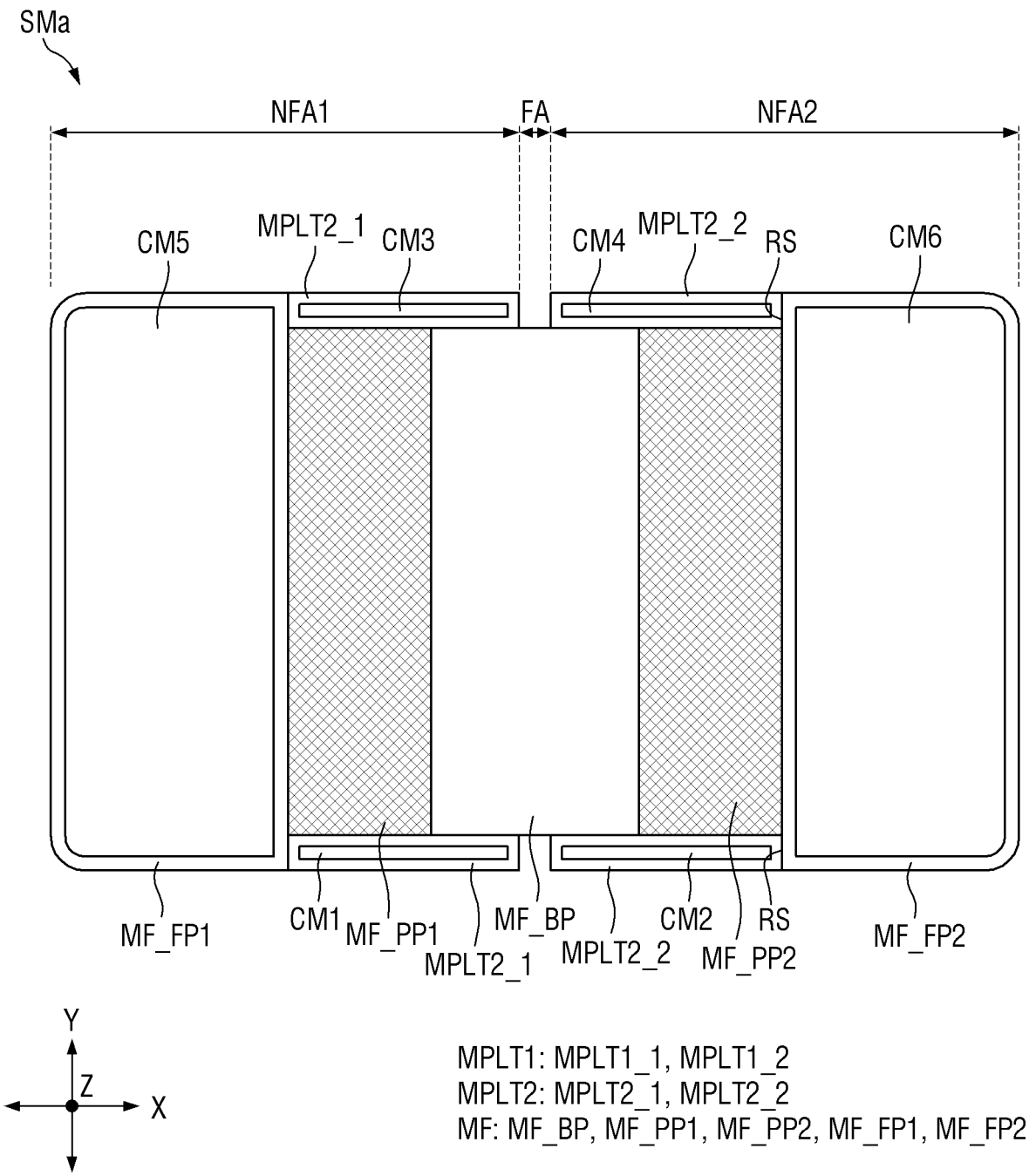
FIG. 11 is a plan view of the support member according to an embodiment.
Figure 12:
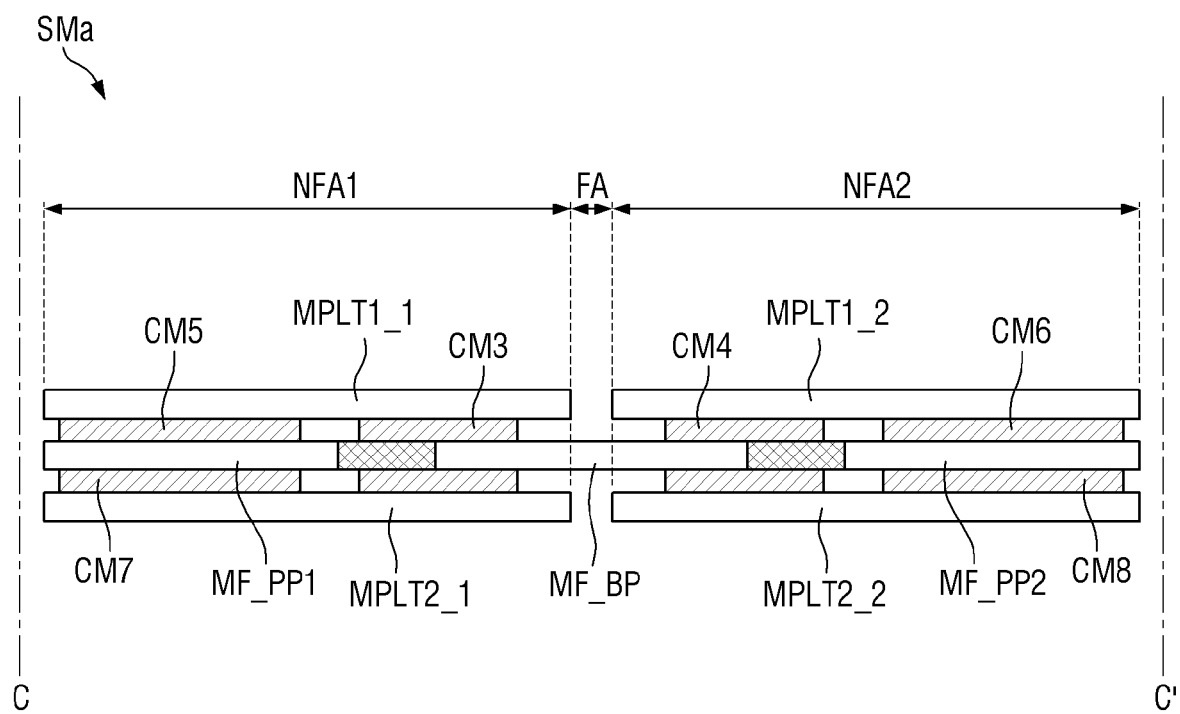
FIG. 12 is a cross-sectional view taken along the line C-C' of FIG. 10.
Figure 13:
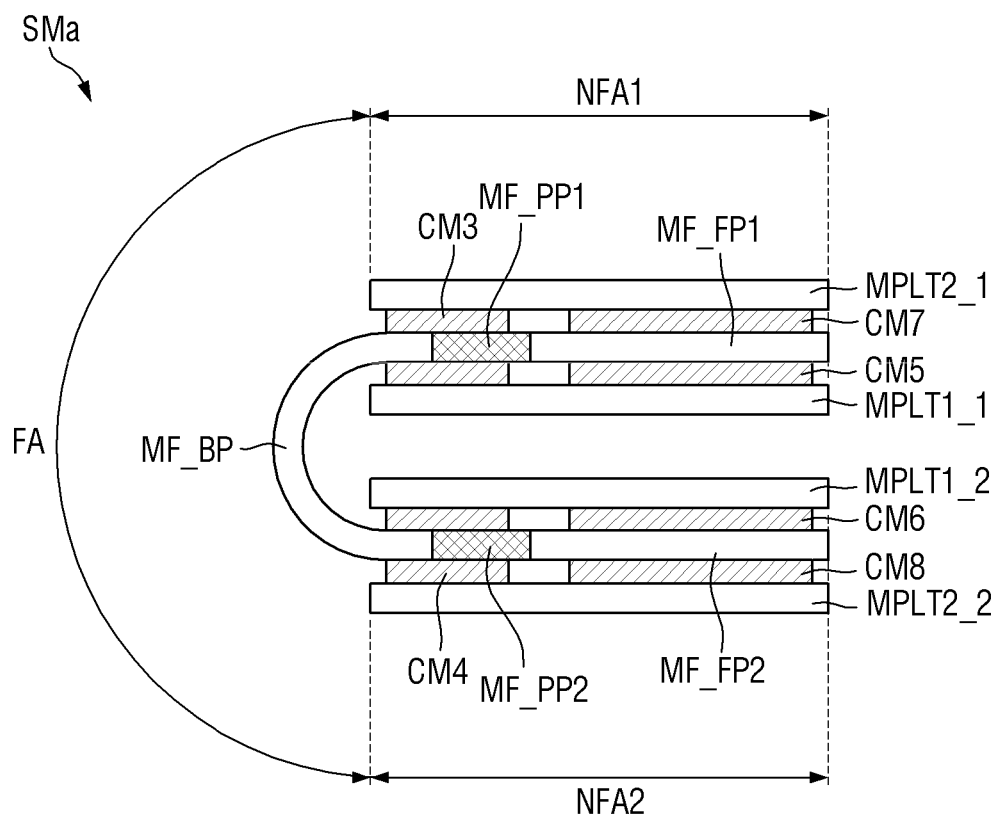
FIG. 13 is a cross-sectional view of the support member in a folded state according to an embodiment.
Figure 13:
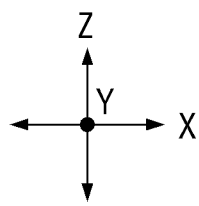

FIG. 10 is a perspective view of a support member according to an embodiment. FIG. 11 is a plan view of the support member according to an embodiment. FIG. 12 is a cross-sectional view taken along the line C-C' of FIG. 10. FIG. 13 is a cross-sectional view of the support member in a folded state according to an embodiment.

Referring to FIGS. 10 and 11, widths of a first stretchable part MF_PP1, a second stretchable part MF_PP2, a first fixing part MF_FP1, and a second fixing part MF_FP2 of a foreign material blocking member MF may be variously changed in a suitable manner.

The widths of the first fixing part MF_FP1 and the second fixing part MF_FP2 in a first direction X may be greater than the widths of the first stretchable part MF_PP1 and the second stretchable part MF_PP2 in the first direction X. A width of a blocking part MF_BP in the first direction X may be greater than the width of the first stretchable part MF_PP1 and the second stretchable part MF_PP2 in the first direction X and may be smaller than the width of the first fixing part MF_FP1 and the second fixing part MF_FP2 in the first direction X.

Because the first fixing part MF_FP1 and the second fixing part MF_FP2 are disposed to have a relatively large area in a plan view, areas, in which a fifth coupling member CM5, a sixth coupling member CM6, a seventh coupling member CM7, and an eighth coupling member CM8 disposed on the first fixing part MF_FP1 and the second fixing part MF_FP2, may also be increased.

For example, as shown in FIGS. 11 and 12, widths of the fifth coupling member CM5 and the sixth coupling member CM6 in the first direction X may be greater than the widths of the first stretchable part MF_PP1 and the second stretchable part MF_PP2 in the first direction X. Widths of the seventh coupling member CM7 and the eighth coupling member CM8 in the first direction X may also be greater than the widths of the first stretchable part MF_PP1 and the second stretchable part MF_PP2 in the first direction X. In this case, widths of a first coupling member CM1, a second coupling member CM2, a third coupling member CM3, and a fourth coupling member CM4 in the first direction X may be greater than the widths of the first stretchable part MF_PP1 and the second stretchable part MF_PP2 in the first direction X and may be smaller than the widths of the first fixing part MF_FP1 and the second fixing part MF_FP2 in the first direction X.

Because areas and/or sizes, in which the fifth coupling member CM5, the sixth coupling member CM6, the seventh coupling member CM7, and the eighth coupling member CM8 are disposed, are increased, a coupling force between the foreign material blocking member MF and an upper support member MPLT1 and between the foreign material blocking member MF and a lower support member MPLT2 may be increased, thereby preventing or reducing the separation, deformation, and/or damage of the foreign material blocking member MF that occur during repeated folding.

In the embodiments of FIGS. 10 to 13, except for the foreign material blocking member MF, components are substantially the same as or similar to those of the embodiments of FIGS. 1 to 8, and thus redundant descriptions thereof may not be repeated.

According to a display device according to various embodiments of the present disclosure, it is possible to block a foreign material from being introduced from the outside.

Effects of the present disclosure are not limited to the embodiments set forth herein and more diverse effects are included in the present specification.

In concluding the detailed description, those skilled in the art will appreciate that many variations and modifications can be made to the embodiments without substantially departing from the principles of the present disclosure. Therefore, the disclosed preferred embodiments of the present disclosure are used in a generic and descriptive sense only and not for purposes of limitation.

While the present disclosure has been particularly shown and described with reference to embodiments thereof, it will be understood by those of ordinary skill in the art that various changes in form and details may be made therein without departing from the spirit and scope of the present disclosure as set forth in the following claims and their equivalents.

What is claimed is:

1. A display device comprising:
a display panel;
a first upper support member on the display panel;
a second upper support member on the display panel and spaced from the first upper support member; and
a blocking member comprising a blocking part crossing the first upper support member and the second upper support member, a first stretchable part connected to a side of the blocking part and comprising a plurality of openings, a second stretchable part connected to another side of the blocking part and comprising a plurality of openings, a first fixing part connected to the first stretchable part, and a second fixing part connected to the second stretchable part, wherein the first fixing part and the second fixing part are attached to the first upper support member and the second upper support member, respectively, and wherein the blocking part, the first stretchable part, and the second stretchable part are not attached to the first upper support member and the second upper support member.

2. The display device of claim 1, wherein a width of the blocking part is greater than a distance between the first upper support member and the second upper support member.

3. The display device of claim 1, wherein a strain rate of each of the first stretchable part and the second stretchable part is greater than that of the blocking part.

4. The display device of claim 1, wherein the first stretchable part and the second stretchable part are to be stretched in a direction intersecting a thickness direction of the first stretchable part and the second stretchable part, respectively.

5. The display device of claim 1, wherein at least one of the blocking part, the first stretchable part, and the second stretchable part is to move in a sliding manner with respect to at least one of the first upper support member and the second upper support member.

6. The display device of claim 1, further comprising:
a first coupling member coupling the first fixing part to the first upper support member; and
a second coupling member coupling the second fixing part to the second upper support member.

7. The display device of claim 1, further comprising:
a first lower support member overlapping the first upper support member in a thickness direction of the first lower support member; and
a second lower support member overlapping the second upper support member in a thickness direction of the second lower support member.

8. The display device of claim 7, wherein the first stretchable part and the first fixing part are between the first upper support member and the first lower support member, and
wherein the second stretchable part and the second fixing part are between the second upper support member and the second lower support member.

9. The display device of claim 7, further comprising:
a first coupling member coupling the first upper support member to the first lower support member; and
a second coupling member coupling the second upper support member to the second lower support member.

10. The display device of claim 9, wherein the blocking member comprises recessed portions recessed inward in a plan view, and wherein the first coupling member and the second coupling member are arranged in the recessed portions.

11. The display device of claim 1, wherein the first stretchable part is greater in area than the first fixing part, and
wherein the second stretchable part is greater in area than the second fixing part.

12. The display device of claim 1, wherein the first stretchable part is smaller in area than the first fixing part, and
wherein the second stretchable part is smaller in area than the second fixing part.

13. The display device of claim 1, wherein each of the first upper support member and the second upper support member comprises a metal, and
wherein the blocking part comprises a plastic.

14. A display device comprising:
a display panel comprising a folding area;
a first upper support member on the display panel;
a second upper support member on the display panel and spaced from the first upper support member; and
a blocking member comprising a first non-pattern area crossing the first upper support member and the second upper support member and overlapping with the folding area, a first pattern area connected to a side of the first non-pattern area and comprising a plurality of openings, a second pattern area connected to another side of the first non-pattern area and comprising a plurality of openings, a second non-pattern area connected to the first pattern area, and a third non-pattern area connected to the second pattern area, the first pattern area and the second pattern area being spaced apart from the folding area,
wherein the second non-pattern area and the third non-pattern area are attached to the first upper support member and the second upper support member, respectively, and
wherein the first non-pattern area, the first pattern area, and the second pattern area are not attached to the first upper support member and the second upper support member.

15. The display device of claim 14, wherein a width of the first non-pattern area is greater than a distance between the first upper support member and the second upper support member.

16. The display device of claim 14, wherein a strain rate of each of the first pattern area and the second pattern area is greater than that of the first non-pattern area.

* * * * *